(12) United States Patent
Li et al.

US012211912B2

(10) Patent No.: US 12,211,912 B2
(45) Date of Patent: Jan. 28, 2025

(54) SEMICONDUCTOR DEVICE AND FABRICATION METHOD THEREOF

(71) Applicant: INNOSCIENCE (ZHUHAI) TECHNOLOGY CO., LTD., Zhuhai (CN)

(72) Inventors: Hao Li, Zhuhai (CN); Anbang Zhang, Zhuhai (CN); Jian Wang, Zhuhai (CN); Haoning Zheng, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 1206 days.

(21) Appl. No.: 16/968,877

(22) PCT Filed: Jun. 30, 2020

(86) PCT No.: PCT/CN2020/099284
§ 371 (c)(1),
(2) Date: Aug. 11, 2020

(87) PCT Pub. No.: WO2022/000269
PCT Pub. Date: Jan. 6, 2022

(65) Prior Publication Data
US 2022/0376070 A1    Nov. 24, 2022

(51) Int. Cl.
*H01L 29/423*    (2006.01)
*H01L 29/20*    (2006.01)
(Continued)

(52) U.S. Cl.
CPC .... *H01L 29/42316* (2013.01); *H01L 29/2003* (2013.01); *H01L 29/401* (2013.01);
(Continued)

(58) Field of Classification Search
CPC .............. H01L 29/2003; H01L 29/402; H01L 29/42316; H01L 29/41725; H01L 29/7787;
(Continued)

(56) References Cited

U.S. PATENT DOCUMENTS 10,529,802 B2 *   1/2020   Mizan ................. H01L 23/5226
10,553,688 B2 *   2/2020   Mizue ............... H01L 29/66462
(Continued)

FOREIGN PATENT DOCUMENTS

CN        1954440       4/2007
CN      105826370 A     8/2016
(Continued)

OTHER PUBLICATIONS

International Search Report and Written Opinion of the corresponding PCT application No. PCT/CN2020/099284 mailed on Mar. 26, 2021.
(Continued)

*Primary Examiner* — Phat X Cao
(74) *Attorney, Agent, or Firm* — JCIPRNET

(57) ABSTRACT

The present disclosure provides a semiconductor device and a fabrication method thereof. The semiconductor device includes a III-nitride layer, a gate, a connection structure, and a gate bus. The gate is disposed over the III-nitride layer. The connection structure is disposed over the gate. The gate bus extends substantially in parallel to the gate and disposed over the connection structure from a top view perspective. The gate bus is electrically connected to the gate through the connection structure.

20 Claims, 26 Drawing Sheets

(51) Int. Cl.
*H01L 29/40* (2006.01)
*H01L 29/417* (2006.01)
*H01L 29/66* (2006.01)
*H01L 29/778* (2006.01)

(52) U.S. Cl.
CPC ...... *H01L 29/402* (2013.01); *H01L 29/41758* (2013.01); *H01L 29/41775* (2013.01); *H01L 29/66462* (2013.01); *H01L 29/7786* (2013.01)

(58) Field of Classification Search
CPC ......... H01L 29/41758; H01L 29/66462; H01L 23/4824; H01L 29/7783
See application file for complete search history.

(56) References Cited

U.S. PATENT DOCUMENTS

| | | | |
|---|---|---|---|
| 11,417,746 B2 * | 8/2022 | Trang | .................. H01L 23/4824 |
| 2003/0160324 A1 | 8/2003 | Dragon et al. | |
| 2007/0249119 A1 | 10/2007 | Saito | |
| 2012/0199847 A1 | 8/2012 | Takagi | |
| 2013/0277687 A1 * | 10/2013 | Kobayashi | .......... H01L 29/2003 257/280 |
| 2017/0271258 A1 | 9/2017 | Wood et al. | |
| 2020/0044024 A1 | 2/2020 | Mokhti et al. | |

FOREIGN PATENT DOCUMENTS

| | | |
|---|---|---|
| CN | 109904226 A | 6/2019 |
| CN | 110168936 | 8/2019 |
| EP | 2634809 A2 | 9/2013 |

OTHER PUBLICATIONS

State Intellectual Property Office of the People's Republic of China, Office Action and Search Report Issued in Application No. 2020800017735, Mar. 4, 2023, 14 pages. (Submitted with Machine Translation).

State Intellectual Property Office of the People's Republic of China, Office Action and Search Report Issued in Application No. 2020800017735, Jul. 27, 2023, 16 pages. (Submitted with Machine Translation).

* cited by examiner

SEMICONDUCTOR DEVICE AND FABRICATION METHOD THEREOF

BACKGROUND

1. Technical Field

The present disclosure relates to a semiconductor device and a fabrication method thereof, and more particularly to a semiconductor device including a connection structure connecting a gate bus and a gate and a fabrication method thereof.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY OF THE INVENTION

In some embodiments of the present disclosure, a semiconductor device is provided, which includes a III-nitride layer, a gate, a connection structure, and a gate bus. The gate is disposed over the III-nitride layer. The connection structure is disposed over the gate. The gate bus extends substantially in parallel to the gate and disposed over the connection structure from a top view perspective. The gate bus is electrically connected to the gate through the connection structure.

In some embodiments of the present disclosure, a semiconductor device is provided, which includes a III-nitride layer, a first ohmic contact layer, a second ohmic contact layer, a first gate, a first connection structure, a second connection structure, and a gate bus. The first ohmic contact layer and the second ohmic contact layer are over the III-nitride layer. The first gate extends between the first ohmic contact layer and the second ohmic contact layer along a first direction. The first connection structure and the second connection structure are disposed over the first gate. The gate bus iu extends substantially in parallel to the first gate along the first direction and disposed over the first connection structure and the second connection structure from a top view perspective. The gate bus is electrically connected to the first gate through the first connection structure and the second connection structure.

In some embodiments of the present disclosure, a method for manufacturing a semiconductor device is provided. The method includes forming a III-nitride layer, and forming a gate over the III-nitride layer. The method for manufacturing a semiconductor device also includes forming a connection structure over the gate. The method for manufacturing a semiconductor device further includes forming a gate bus over the connection structure from a top view perspective. The gate bus extends substantially in parallel to the gate, and the gate bus is electrically connected to the gate through the connection structure.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

PREFERRED EMBODIMENT OF THE PRESENT INVENTION

Figure 1:
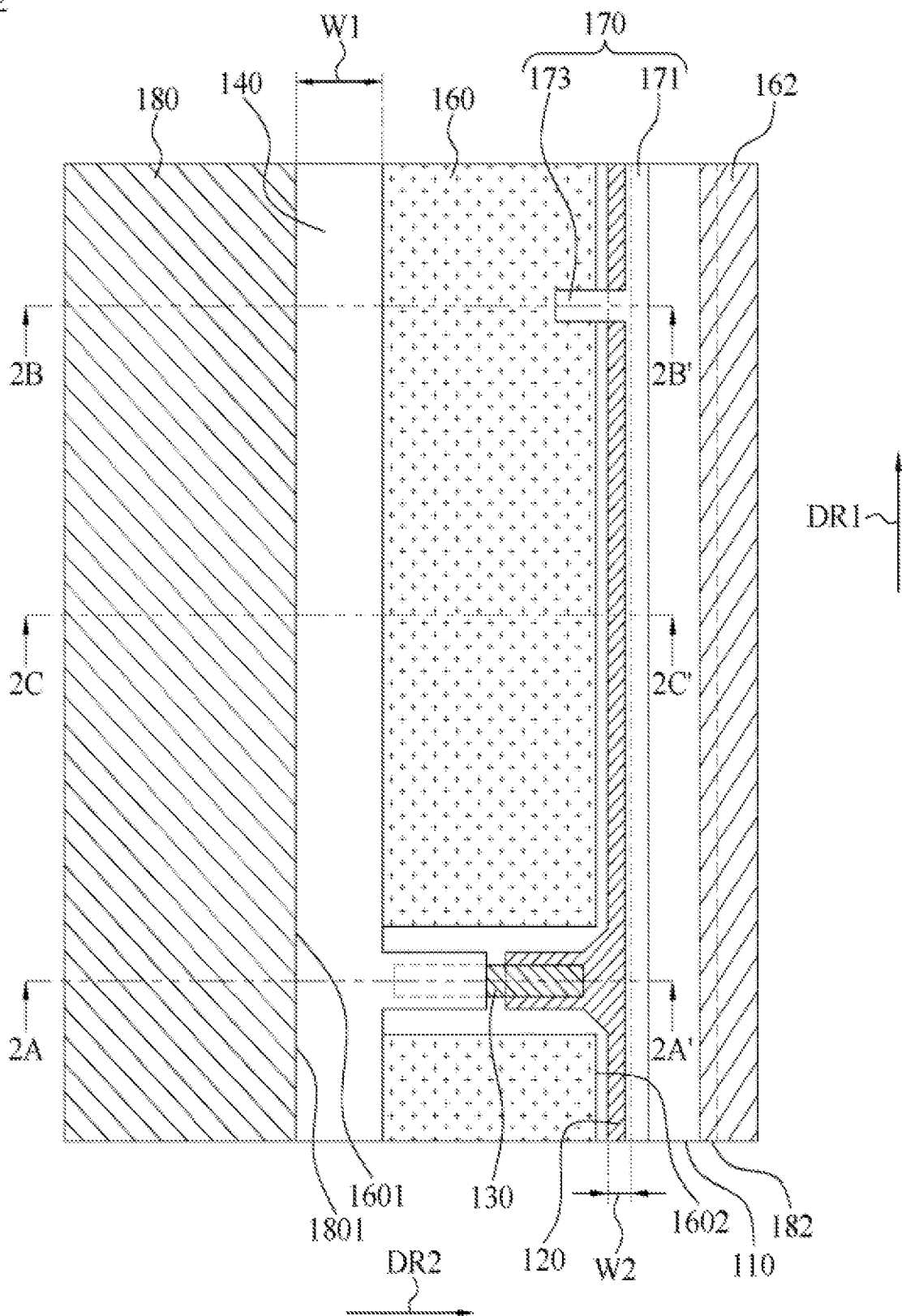
FIG. 1 is a top view of a semiconductor device according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a top view of a semiconductor device 10 according to some embodiments of the present disclosure. The semiconductor device 10 can work at relatively great or high voltage level (e.g. greater than 600 V) to function as a high voltage transistor). The semiconductor device 10 can work at relatively great or high frequency (e.g. greater than 6 GHz).

Referring to FIG. 1, the semiconductor device 10 may include a III-V III-nitride layer 110, a gate 120, a connection structure 130, a gate bus 140, ohmic contact layers 160 and 162, a conductive layers 170, and conductive layers 180 and 182.

The III-nitride layer 110 may be formed on a substrate (not illustrated in FIG. 1). The substrate may include, without limitation, silicon (Si), doped Si, silicon carbide (SiC), germanium silicide (SiGe), gallium arsenide (GaAs), or other semiconductor materials. The substrate may include, without limitation, sapphire, silicon on insulator (SOI), or other suitable materials. The substrate may further include a doped region, for example, a p-well, an n-well, or the like.

The gate 120 (which can also be referred to as "gate finger") may be disposed over the III-nitride layer 110. The gate 120 may extend along a direction DR1 as shown in FIG. 1. The gate 120 may have a width W2 (which can also be referred to as "a gate length") along a direction DR2 that is substantially perpendicular to the direction DR1. The width W2 of the gate 120 may range from about 0.05 μm to about 0.5 μm. The width W2 of the gate 120 may range from about 0.1 μm to about 1 μm. The width W2 of the gate 120 may range from about 0.5 μm to about 5 μm. A relatively less width W2 of the gate 120 can increase the speed for gate switch, which facilitates the applications of the semiconductor device 10 in RF devices.

The gate 120 can include a gate metal. The gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials. A two-dimensional electron gas (2DEG) region (not illustrated in FIG. 1) may be formed under the gate 120 and preset to be in an ON state when the gate 120 is in a zero bias state. Such a device can be referred to as a depletion-mode device.

The connection structure 130 may be disposed over the gate 120. The connection structure 130 may extend along the direction DR2. The connection structure 130 may extend substantially perpendicular to the gate 120. The connection structure 130 may include a conductive material. The conductive material may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable conductive materials.

The gate bus 140 may extend substantially in parallel to the gate 120. The gate bus 140 may be disposed over the connection structure 130. The gate bus 140 may have a width W1 along the direction DR2. The width W1 of the gate bus 140 along the direction DR2 may be greater than the width W2 of the gate 120 along the direction DR2. A ratio W1/W2 of the width W1 of the gate bus 140 to the width W2 of the gate 120 may be equal to or greater than approximately 5.

The gate bus 140 may be electrically connected to the gate 120 through the connection structure 130. The connection structure 130 may be disposed between the gate bus 140 and the gate 120. While the relatively less width W2 of the gate 120 may indicate an increase in the gate resistance along the direction DR1, the gate bus 140 is adopted to be connected to the gate 120 through the connection structure 130, such that the overall gate resistance can be maintained relatively low.

The ohmic contact layer 160 may be disposed over the III-nitride layer 110. The ohmic contact layer 162 may be disposed over the III-nitride layer 110. The gate 120 may extend between the ohmic contact layer 160 and the ohmic contact layer 162 along the direction DR1. The ohmic contact layer 160 may serve as a source electrode, and the ohmic contact layer 162 may serve as a drain electrode. The ohmic contact layers 160 and 162 may independently include, for example, without limitation, a conductor material. The conductor materials may include, but are not limited to, for example, metals, alloys, doped semiconductor materials (e.g., doped crystalline silicon), or other suitable conductor materials.

The conductive layer 170 may be disposed adjacent to the gate 120. The conductive layer 170 may be disposed between the gate 120 and the ohmic contact layer 162 (which can also be referred to as "the drain electrode") from a top view perspective. The conductive layer 170 may be partially above the gate 120. The conductive layer 170 may serve as a field plate. The conductive layer 170 can include a conductive material. The conductive layer 170 can be at zero potential and connected to the ohmic contact layer 160 (which can also be referred to as "the source electrode"). According to some embodiments of the present disclosure, the conductive layer 170 allows the electric field between the conductor structures (for example, the gate 120, the ohmic contact layer 160, and the ohmic contact layer 162) to distribute evenly, improves the tolerance to voltage, and permits the voltage to release slowly, thereby improving the device reliability.

The conductive layer 170 may be electrically connected to the ohmic contact layer 160. The conductive layer 170 may include a portion 171 and a portion 173 connected to the portion 171. The portion 171 of the conductive layer 170 may extend substantially in parallel to the gate 120 along the direction DR1. The portion 173 of the conductive layer 170 may cross over a portion of the gate 120. According to some embodiments of the present disclosure, the conductive layer 170 electrically connecting to the ohmic contact layer 160 (which can also be referred to as "the source electrode") can facilitate the balance of the electric potential of the conductive layer 170 (which can also be referred to as "the field plate").

The conductive layer 180 may be disposed over the III-nitride layer 110. The conductive layer 182 may be disposed over the III-nitride layer 110. The conductive layers 180 and 182 can independently include a conductive material. The conductive material may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable conductive materials.

Figure 2A:
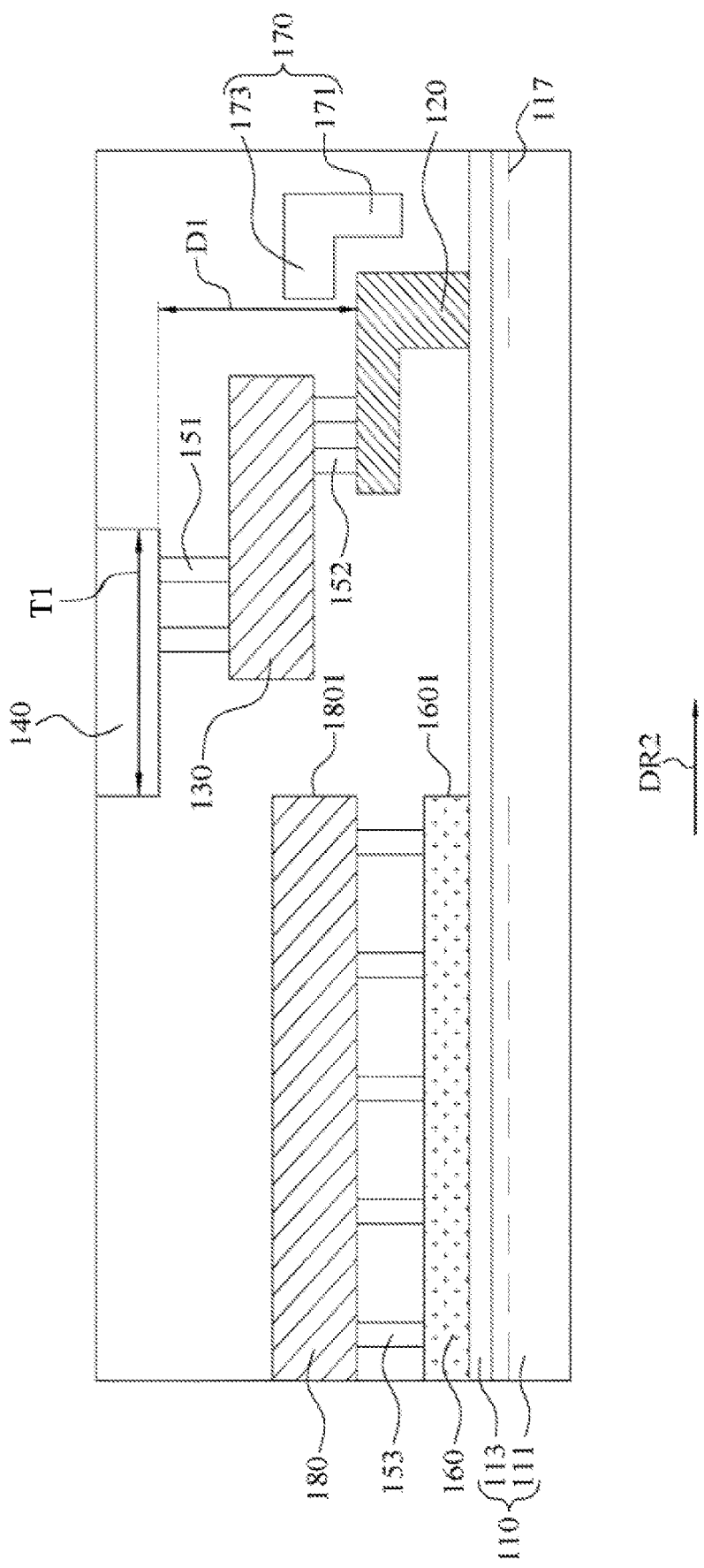
FIG. 2A is a cross-sectional view across the line 2A-2A' in FIG. 1 according to some embodiments of the present disclosure.

FIG. 2A is a cross-sectional view across the line 2A-2A' in FIG. 1 according to some embodiments of the present disclosure.

The III-nitride layer 110 may include a III-nitride layer 111 and a III-nitride layer 113 formed on the III-nitride layer 111. The III-nitride layer 111 can include, without limitation, a group III nitride, for example, a compound $In_xAl_yGa_{1-x-y}N$, in which x+y≤1. The group III nitride may further include, but is not limited to, for example, a compound $Al_yGa_{(1-y)}N$, in which y≤1. For example, the III-nitride layer 111 can include a GaN layer having a bandgap of about 3.4 eV. The III-nitride layer 113 may be in direct contact with the III-nitride layer 111. The III-nitride layer 113 can include, without limitation, a group III nitride, for example, a compound $In_xAl_yGa_{1-x-y}N$, in which x+y≤1. The group III nitride may further include, but is not limited to, for example, a compound $Al_yGa_{(1-y)}N$, in which y≤1. For example, the III-nitride layer 113 can include AlGaN having a band gap of about 4 eV.

A heterojunction is formed between the III-nitride layer 111 and the III-nitride layer 113, e.g., at an interface of the III-nitride layer 111 and the III-nitride layer 113, and the polarization of the heterojunction of different nitrides forms a two-dimensional electron gas (2DEG) region 117 adjacent to the interface of the III-nitride layer 111 and the III-nitride layer 113. The 2DEG region 117 may be formed in the III-nitride layer 111.

The connection structure 130 may be stacked or sandwiched between the gate 120 and the gate bus 140. The connection structure 130 may be disposed at an elevation lower than the gate bus 140. The connection structure 130 may be disposed at an elevation higher than the gate 120.

Referring back to FIG. 1, the connection structure 130 may overlap the gate 120 from a top view perspective. The connection structure 130 may overlap the gate 120 from a top view perspective. The connection structure 130 may be located directly or immediately above a region (e.g., a non-active region, where there is no 2DEG) free from the ohmic contact layer 160 from a top view perspective. The connection structure 130 may not overlap the ohmic contact layer 160. As discussed above with reference to FIG. 1, parasitic capacitance formed by the gate 120 and the 2DEG 117 can be ignored because of relatively less width of the gate 120.

Referring to FIG. 2A, the gate 120 is connected to the gate bus 140 through the connection structure 130. The connection structure 130 can be located directly or immediately above a non-active region. No parasitic capacitance is resulted from the connection structure 130 because there is no 2DEG in the non-active region.

The gate bus 140 and the gate 120 are spaced apart by a distance D1. The distance D1 may range from about 5 μm to about 40 μm. The distance D1 may range from about 10 μm to about 20 μm. The relatively great distance D1 between the gate bus 140 and the gate 120 can receive or accommodate the connection structure 130.

The gate bus 140 may have a thickness T1 along the direction DR2. The thickness T1 of the gate bus 140 may range from about 0.5 μm to about 6μ, m. The thickness T1 of the gate bus 140 may range from about 1 μM to about 3 μm. The thickness T1 of the gate bus 140 may range from about 5 μm to about 20 μm. Despite that the gate bus 140 can have a relatively great width W1, a relatively great thickness T1 of the gate bus 140 can further reduce resistance resulted therefrom. In other words, the relatively great thickness T1 of the gate bus 140 can mitigate or alleviate resistance issues resulted therefrom. In addition, the reduced resistance can be advantageous to the reduction of parasitic inductance of the gate bus 140.

The ohmic contact layer 160 may be disposed at an elevation lower than the connection structure 130. The ohmic contact layer 160 may be in direct contact with the III-nitride layer 111.

The portion 171 of the conductive layer 170 may be elevationally substantially the same as the gate 120. The portion 171 of the conductive layer 170 may be disposed at an elevation lower than the connection structure 130. The portion 173 of the conductive layer 170 may be above the gate 120. The portion 173 of the conductive layer 170 may be above a portion of the gate 120.

The semiconductor device 10 may further include one or more conductive vias 152 stacked between and electrically connecting the connection structure 130 and the gate 120. The semiconductor device 10 may further include one or more conductive vias 151 disposed between the gate bus 140 and the connection structure 130 and electrically connecting the gate bus 140 and the connection structure 130.

The conductive layer 180 may be disposed above the ohmic contact layer 160. The semiconductor device 10 may further include one or more conductive vias 153 disposed between and electrically connecting the ohmic contact layer 160 and the conductive layer 180. As shown in FIG. 2A, an edge 1801 of the conductive layer 180 may be aligned with an edge 1601 of a portion of the ohmic contact layer 160.

Figure 2B:
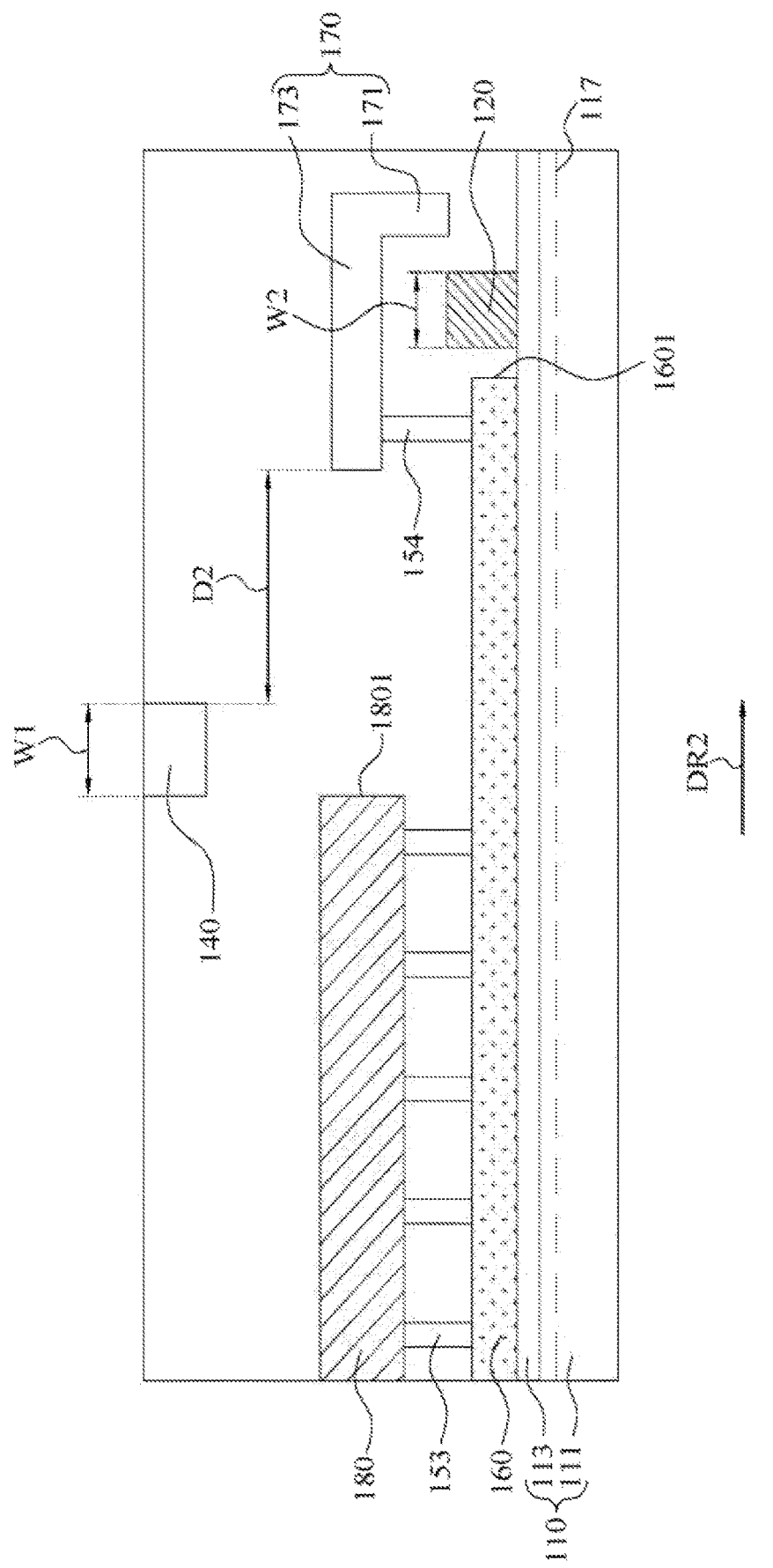
FIG. 2B is a cross-sectional view across the line 2B-2B' in FIG. 1 according to some embodiments of the present disclosure.

FIG. 2B is a cross-sectional view across the line 2B-2B' in FIG. 1 according to some embodiments of the present disclosure.

Referring to FIG. 2B, an edge 1602 of a portion of the ohmic contact layer 160 may protrude from the edge 1801 of the conductive layer 180.

The edge 1602 of a portion of the ohmic contact layer 160 may be directly below the portion 173 of the conductive layer 170. The semiconductor device 10 may further include one or more conductive vias 154 disposed between and electrically connecting the ohmic contact layer 160 and the conductive layer 170. The portion 173 of the conductive layer 170 may extend along the direction DR2 to connect the portion 171 of the conductive layer 170 and the conductive vias 154. The portion 173 of the conductive layer 170 may cross over a portion of the gate 120. A projection of the gate bus 140 and a projection of the portion 173 of the conductive layer 170 may be spaced apart by a distance D2. The distance D2 may range from about 0 μm to about 10 μm. In some other embodiments, the distance D2 between the projection of the gate bus 140 and the projection of the portion 173 of the conductive layer 170 may be substantially zero.

Figure 2C:
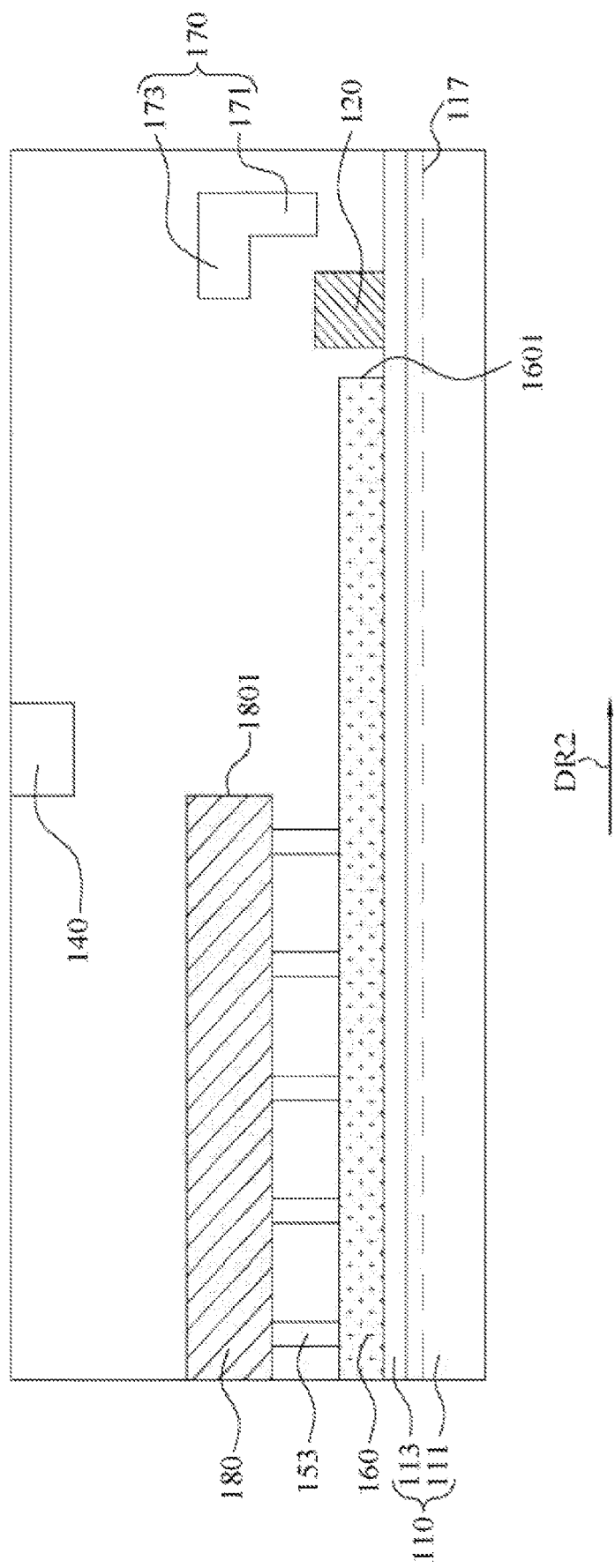
FIG. 2C is a cross-sectional view across the line 2C-2C' in FIG. 1 according to some embodiments of the present disclosure.

FIG. 2C is a cross-sectional view across the line 2C-2C' in FIG. 1 according to some embodiments of the present disclosure.

Referring to FIG. 2C, the edge 1602 of a portion of the ohmic contact layer 160 may protrude from the edge 1801 of the conductive layer 180. The edge 1602 of a portion of the ohmic contact layer 160 may be spaced apart from the gate 120 by a distance.

In some other embodiments, the connection structure 130 and the gate bus 140 can be eliminated, in such scenario, it may be required to increase the gate length (i.e., the width W2) to transmit a relatively great power. However, the relatively great length (i.e., the width W2) of the gate may inevitably increase parasitic gate capacitance, which can adversely affect the performance of the semiconductor device. For example, the relatively great parasitic gate capacitance can reduce or lessen power gain of the semiconductor device. For example, the relatively great parasitic gate capacitance can cause variation or fluctuation of voltage potential over the gate. For example, the relatively great parasitic gate capacitance can reduce or lessen cut-off frequency of the semiconductor device.

Moreover, a relatively narrow and elongated gate may result in uneven, varying or fluctuating electric potential. Such un-uniformity of electric potential of the gate tends to easily happen in the lack of the connection structure 130 and the gate bus 140 as shown in FIG. 2A. Even there is a conductive layer similar to the conductive layer 170 as shown in FIG. 2A to function as a field plate, the performance thereof can be adversely affected. In other words, balance of the electric potential or electrical field can be degraded or deteriorated.

Referring back to FIG. 1, the semiconductor device 10, which includes a relatively long gate bus 140 along the direction DR1 to transfer or transmit relatively great power. Moreover, the overall parasitic gate capacitance is not increased since the gate 120 has a relatively small gate length (e.g., the width W2), which can be ignored as discussed above. For example, the semiconductor device 10 may have an output power ranging from about 30 dBm (1 Watt) to about 50 dBm (100 Watt).

Moreover, a relatively great gate length along the direction DR2 of the gate bus 140 can facilitate a uniform distribution of the electric potential over the gate 120. The conductive layer 170, which is located adjacent to the gate 120, can help to balance the electric potential.

In addition, the gate bus 140 is located above the connection structure 130 which is located above the gate 120, which means the distance or space between the gate bus 140 and the 2DEG 117 in the III-nitride layer 110 is relatively great. Therefore, even there is parasitic capacitance formed by the gate bus 140 and the 2DEG, it is too small to affect performance of the semiconductor device 10. In other words, the parasitic capacitance formed by the gate bus 140 and the 2DEG can be neglected or ignored.

Figure 3A:
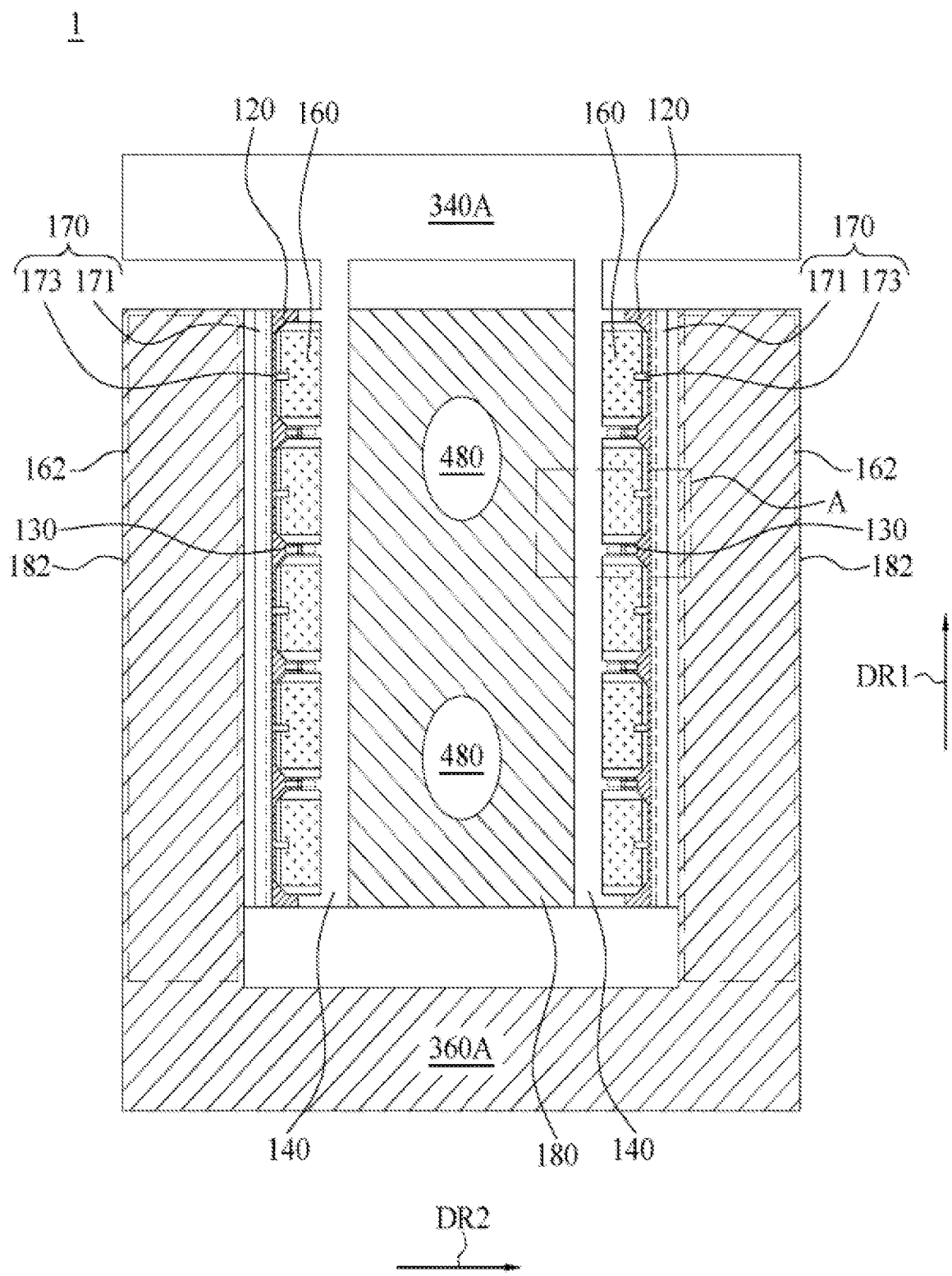
FIG. 3A is a top view of a semiconductor device according to some iu embodiments of the present disclosure.

FIG. 3A is a top view of a semiconductor device 1 according to some embodiments of the present disclosure. In some embodiments, the structure shown in FIG. 1 can be a partial structure in the dashed line box A of FIG. 3A.

Referring to FIG. 3A, the semiconductor device 1 may include a plurality of connection structures 130 disposed over the gate 120. The connection structures 130 may be arranged between the gate bus 140 and the gate 120 from a top view perspective. The connection structures 130 may be arranged extending along the direction DR1. The connection structures 130 may be arranged in substantially parallel to the gate 120 along the direction DR1. The semiconductor device 1 may include a plurality of cells arranged in substantially parallel to the gate 120 along the direction DR1. Each of the connections structures 130 may be arranged corresponding to each of the corresponding cells. Each of the cells may have a cell width ranging from about 20 μm to about 200 μm.

Referring to FIG. 3A (please also see FIG. 2A for reference), the gate bus 140 may extend substantially in parallel to the gate 120 along the direction DR1. The gate bus 140 may be disposed over the connection structures 130 from a top view perspective. The gate bus 140 may be electrically connected to the gate 120 through the connection structures 130.

Referring to FIG. 3A, one portion 173 of the conductive layer 170 may be located between every two adjacent connection structures 130. In some other embodiments, two or more portions 173 of the conductive layer 170 may be located between ever two adjacent connection structures 130 (not illustrated in FIG. 3A). According to some embodiments of the present disclosure, the portion(s) 173 extending from the portion 171 to electrically connect to the ohmic contact layer 160 (which can also be referred to as "the source electrode") can facilitate the balance of the electric potential of the conductive layer 170 (which can also be referred to as "the field plate").

The semiconductor device 1 may further include a gate connection structure 340A. The gate bus 140 may connect the gate 120 to the gate connection structure 340A. The gate connection structure 340A may be connected to a gate bus (not illustrated in FIG. 3A). The semiconductor device 1 may further include a contact pad 360A (e.g., drain pad). The conductive layer 182 may be connected to the contact pad 360A. The semiconductor device 1 may further include contact plugs 480. The contact plugs 480 can serve as source contact plugs. The conductive layer 180 may connect the ohmic contact layer 160 to the contact plugs 480. In some embodiments, the semiconductor device 1 may further include an electrostatic discharge (ESD) device (not illustrated in FIG. 3A) connected to the gate connection structure 340A. The ESD device may include parallel diodes, ggNMOS, gcNMOS, or the like.

In some other embodiments, the connection structure 130 and the gate bus 140 are eliminated from the semiconductor device 10. In order to achieve a relatively high power of the semiconductor device by increasing the number of cells in the semiconductor device, an increase of the number of the gates 120 is usually required. However, with the increase of the number of the gates 120, a lateral length of the device area along the direction DR2 is undesirably increased accordingly. The increased lateral length of the device area along the direction DR2 can increase the difficulty and complexity of packaging, and relatively long conductive lines along the direction DR2 can cause undesired parasitic inductance and parasitic resistance. In addition, a relatively great number of gates 120 arranged along the direction DR2 of the device area can cause ununiform distribution of current and/or voltage of the device area along the direction DR2, and the phase of signals transmitted along the direction DR2 may be adversely affected.

According to some embodiments of the present disclosure, the gate 120 is electrically connected to the gate bus 140 through the connection structures 130, the connection structures 130 are arranged along the direction DR2 substantially in parallel to the extending direction of the gate 120 and the gate bus 140. As such, the number of cells along the direction DR2 can be increased, and thus the lateral length (e.g., along the direction DR1) of the device area can be relatively short. Therefore, a relatively high power of the semiconductor device 10 can still be achieved by including a relatively great number of cells, the distribution of current and/or voltage along the lateral direction of the device area can be relatively uniform, and the phase of signals transmitted along the lateral direction can be relatively stable, thus the conductance properties of the semiconductor device 1 can be improved.

In addition, according to some embodiments of the present disclosure, with the aforementioned design of the gate 120, the connection structures 130 and the gate bus 140, the lateral length (e.g., along the direction DR1) of the device area can be relatively short. Accordingly, the packaging is simplified, the device area utilization is more efficient, and the undesired parasitic inductance caused by relatively long conductive lines along the direction DR1 can be reduced.

Moreover, according to some embodiments of the present disclosure, multiple connection structures 130 electrically connect the gate 120 and the gate bus 140. Thus, multiple portions within the relatively long gate 120 are electrically connected to multiple portions within the relatively long gate bus 140 through the multiple connection structure 130. Such structure can generate multiple electrical parallel conduction paths. Therefore, the parasitic gate resistance of the relatively long gate 120 can be effectively reduced, and thus the turn-on characteristics of the semiconductor device 1 can be improved. In addition, the parasitic gate inductance of the relatively long gate 120 can be effectively reduced as well, and thus the signal phase among various positions of the gate 120 can be uniform.

Figure 3B:
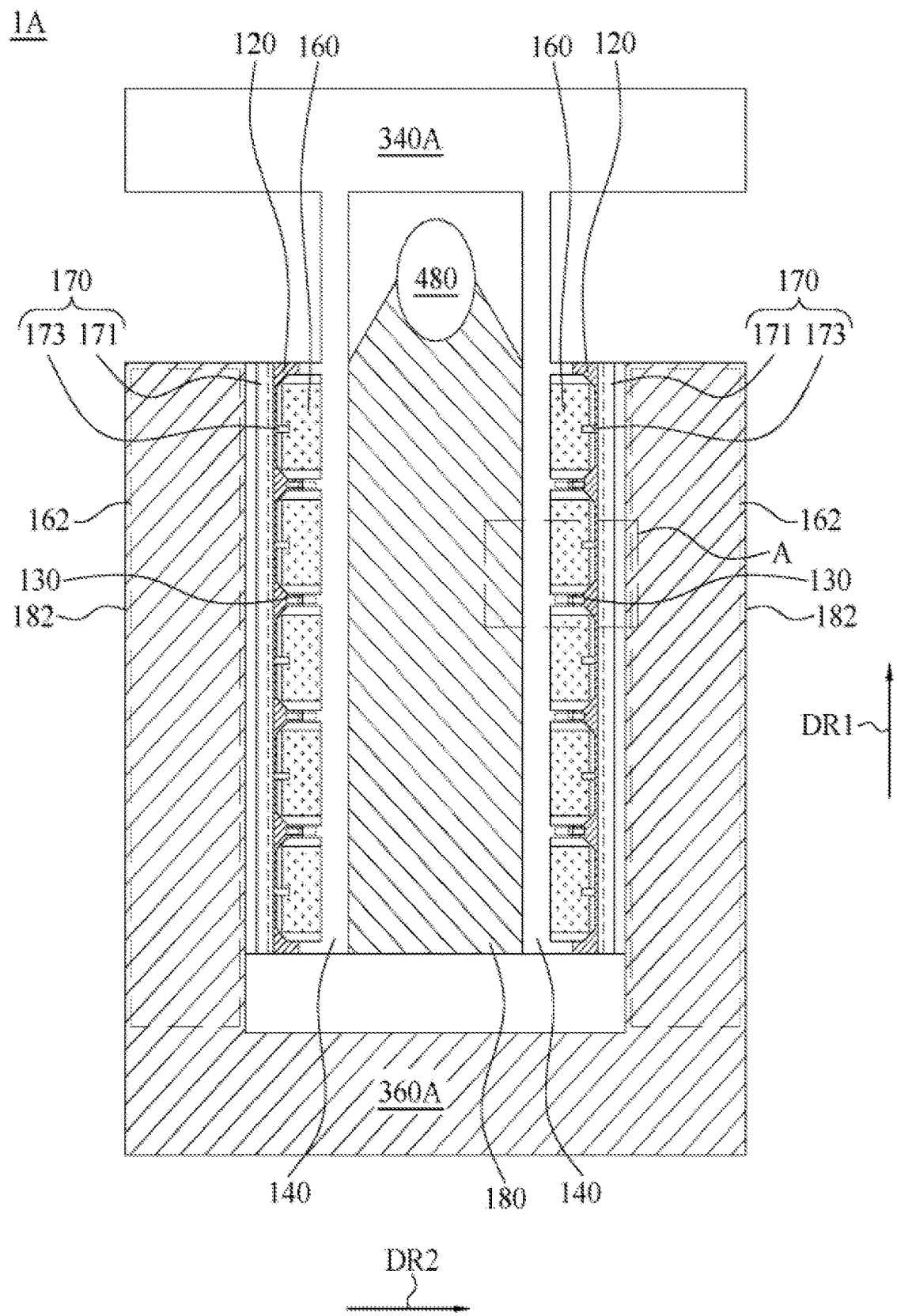
FIG. 3B is a top view of a semiconductor device according to some embodiments of the present disclosure.

FIG. 3B is a top view of a semiconductor device 1A according to some embodiments of the present disclosure. The semiconductor device 1A has a structure similar to the semiconductor device 1 shown in FIG. 3A, except that, for example, the contact plug 480 has a different arrangement.

The contact plug 480 can serve as a source plug. The ohmic contact layer 160 may be under the conductive layer 180, and the contact plug 480 may be disposed at a lateral side of the ohmic contact layer 160. The contact plug 480 may be between the gate connection structure 340A and the ohmic contact layer 160 from a top view perspective. The conductive layer 180 may connect the ohmic contact layer 160 to the contact plug 480. Since the contact plug 480 is not located directly above the ohmic contact layer 160, the lateral length of the conductive layer 180 and the lateral length of the ohmic contact layer 160 along the direction DR2 can be reduced. Therefore, the lateral length of the area occupied by the ohmic contact layer 160 (which can also be referred to as "source region") along the direction DR2 can be reduced, and thus the overall lateral length of the semiconductor device 1A along the direction DR2 can be reduced.

Figure 4:
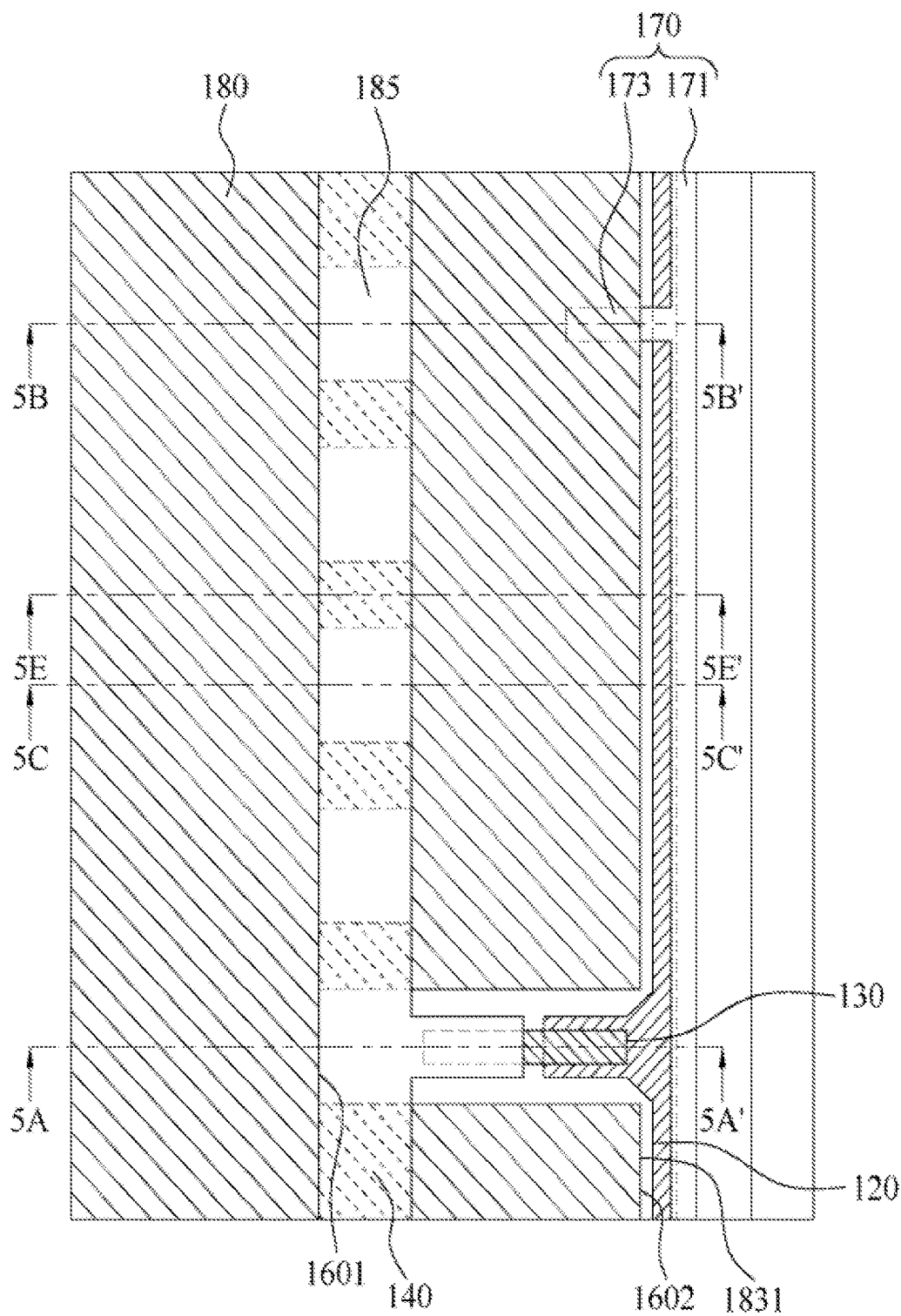
FIG. 4 is a top view of a semiconductor device according to some embodiments of the present disclosure.

FIG. 4 is a top view of a semiconductor device 20 according to some embodiments of the present disclosure. The semiconductor device 20 has a structure similar to the semiconductor device 10 shown in FIG. 1, except that, for example, the conductive layer 180 has a different structure.

The conductive layer 180 may extend below the gate bus 140 from a top view perspective. The conductive layer 180 may define a plurality of openings 185 directly under the gate bus 140. The openings 185 may be arranged along the direction DR1. According to some embodiments of the present disclosure, the openings 185 directly under the gate bus 140 decrease the overlapped area between the conductive layer 180 and the gate bus 140. Therefore, the parasitic capacitance between the conductive layer 180 and the gate bus 140 can be reduced.

The openings 185 may be directly between the gate bus 140 and the ohmic contact layer 160 from a top view perspective. According to some embodiments of the present disclosure, the openings 185 directly between the gate bus 140 and the ohmic contact layer 160 decreases the overlapped area between the conductive layer 180 and the ohmic contact layer 160. Therefore, the parasitic capacitance between the conductive layer 180 and the ohmic contact layer 160 can be reduced.

Figure 5A:
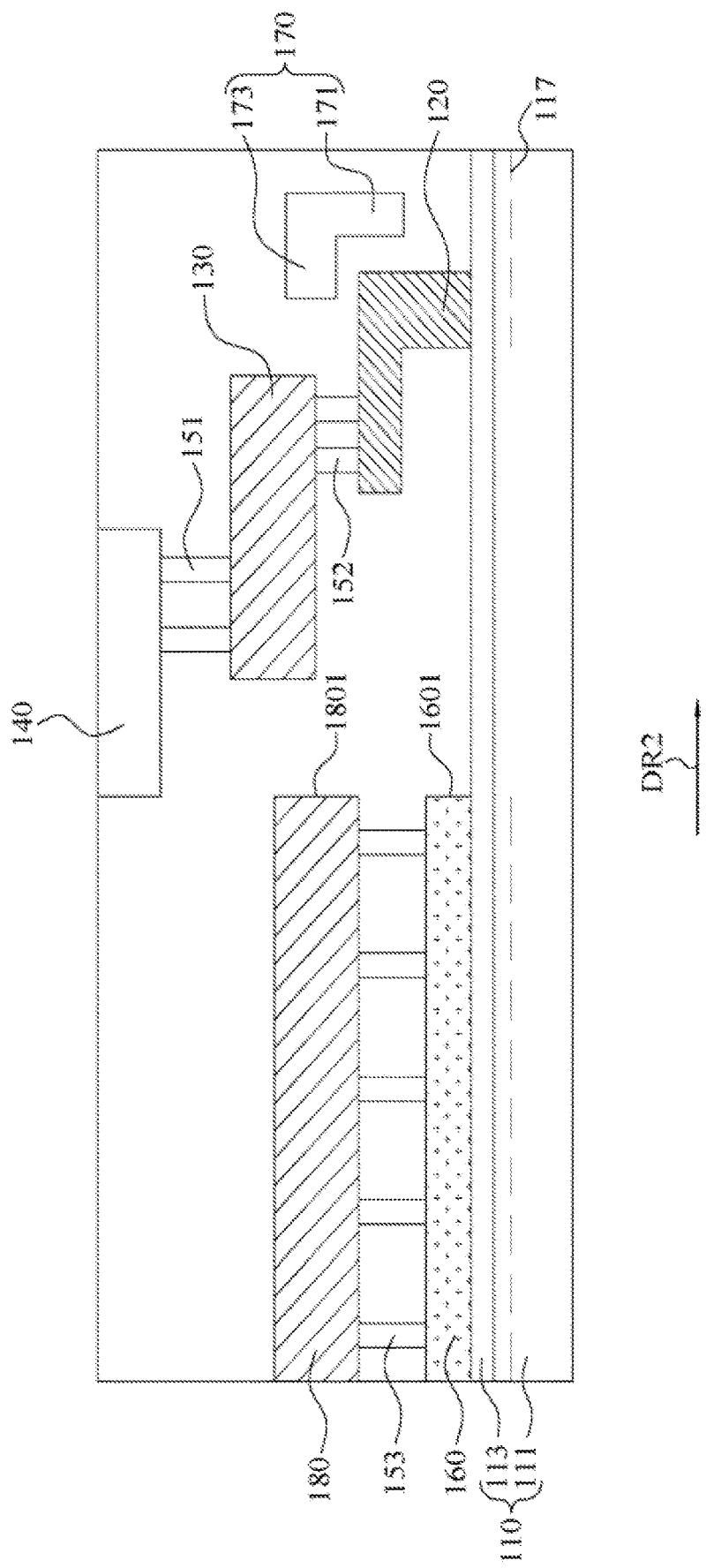
FIG. 5A is a cross-sectional view across the line 5A-5A' in FIG. 4 according to some embodiments of the present disclosure.

FIG. 5A is a cross-sectional view across the line 5A-5A' in FIG. 4 according to some embodiments of the present disclosure.

The connection structure 130 may be stacked between the gate 120 and the gate bus 140. The connection structure 130 may be disposed at an elevation lower than the gate bus 140. The connection structure 130 may be disposed at an elevation higher than the gate 120. Referring to FIG. 5A, an edge 1801 of the conductive layer 180 may be aligned with an edge 1601 of a portion of the ohmic contact layer 160.

Figure 5B:
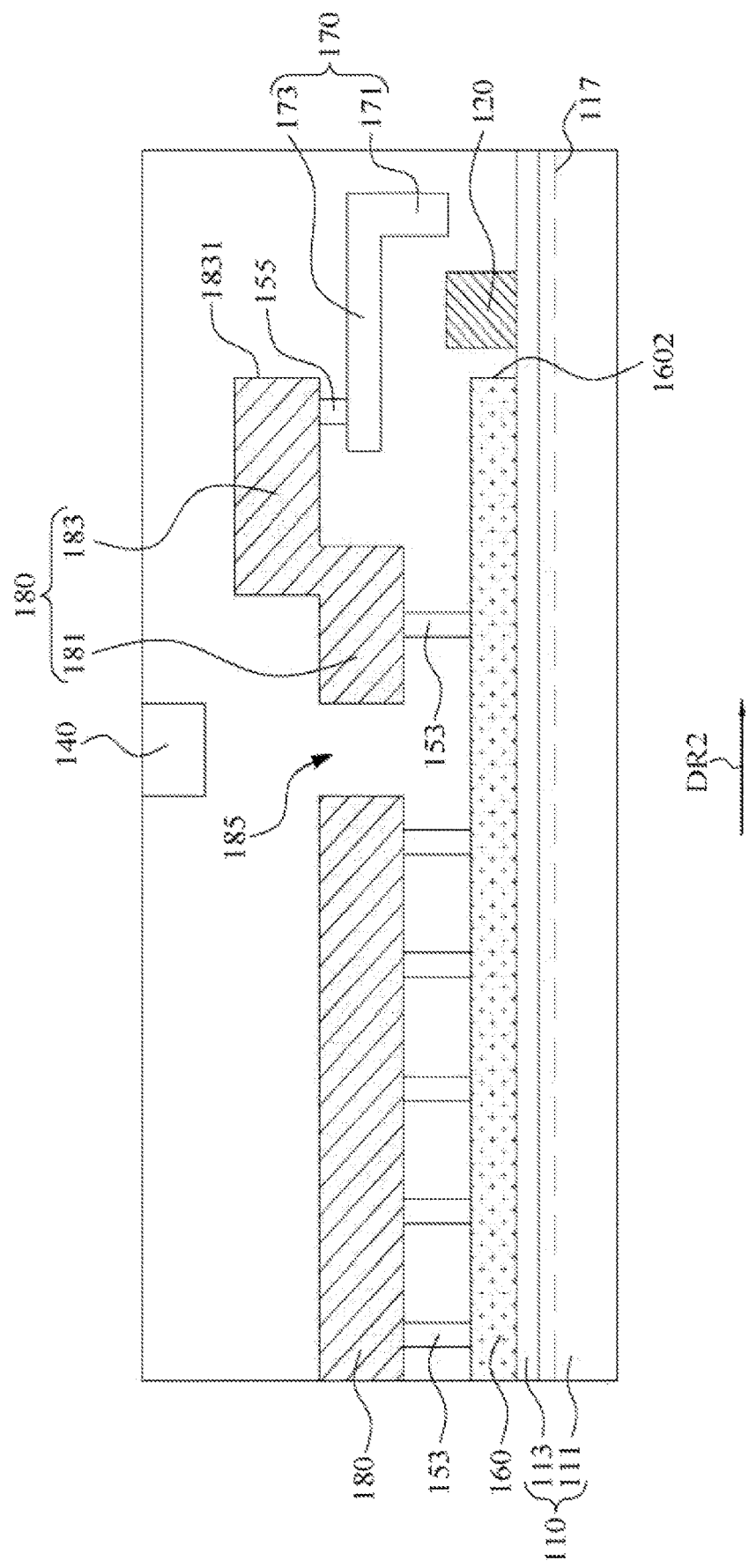
FIG. 5B is a cross-sectional view across the line 5B-5B' in FIG. 4 according to some embodiments of the present disclosure.

FIG. 5B is a cross-sectional view across the line 5B-5B' in FIG. 4 according to some embodiments of the present disclosure.

The portion 173 of the conductive layer 170 may be disposed between the gate 120 and the conductive layer 180. The portion 173 of the conductive layer 170 may be above the gate 120 and electrically connected to the conductive layer 180. The semiconductor device 20 may further include one or more conductive vias 155 stacked between and electrically connecting the conductive layer 180 and the portion 173 of the conductive layer 170.

The conductive layer 180 may include a portion 181 and a portion 183 connected to the portion 181. The portion 183 of the conductive layer 180 may extend towards the gate 120. The portion 183 of the conductive layer may be located between the gate bus 140 and the gate 120 from a top view perspective. A part of the portion 181 of the conductive layer 180 may be located between the gate bus 140 and the gate 120 from a top view perspective.

The portion 181 and the portion 183 may be at different elevations. The portion 183 of the conductive layer 180 may be at an elevation higher than the portion 181 of the conductive layer 180. The portion 181 of the conductive layer 180 and the portion 173 of the conductive layer 170 may be at substantially the same elevation. The one or more conductive vias 155 may be disposed between the portion 173 of the conductive layer 170 and the portion 183 of the conductive layer 180. The openings 185 may be formed within the portion 181 of the conductive layer 180.

According to some embodiments of the present disclosure, the portion 173 extending from the portion 171 to electrically connect to the portion 183 of the conductive layer 180 can facilitate the balance of the electric potential of the conductive layer 170 (which can also be referred to as "the field plate").

An edge 1602 of a portion of the ohmic contact layer 160 may be aligned with an edge 1831 of the portion 183 of the conductive layer 180.

The conductive layer 170 may be electrically connected to the ohmic contact layer 160 through the conductive vias 155, the portions 181 and 183 of the conductive layer 180, and the conductive vias 153.

Figure 5C:
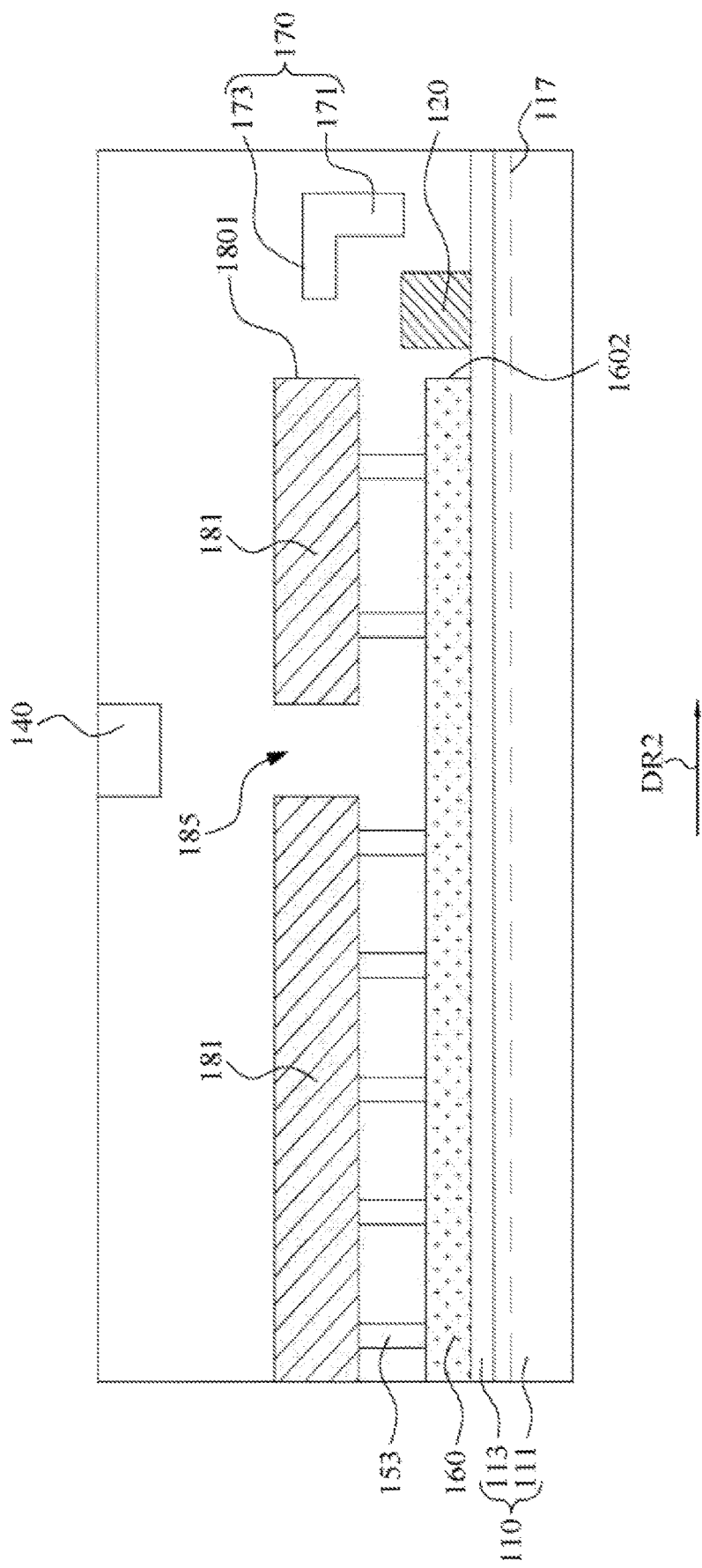
FIG. 5C is a cross-sectional view across the line 5C-5C' in FIG. 4 according to some embodiments of the present disclosure.

FIG. 5C is a cross-sectional view across the line 5C-5C' in FIG. 4 according to some embodiments of the present disclosure.

Referring to FIG. 5C, a part of the portion 181 of the conductive layer 180 may be electrically connected to a portion of the ohmic contact layer 160 adjacent to the gate 120. The part of the portion 181 of the conductive layer 180 may be electrically connected to the portion of the ohmic contact layer 160 adjacent to the gate 120 through the conductive vias 153. According to some embodiments of the present disclosure, the part of the portion 181 of the conductive layer 180 is electrically connected to the ohmic contact layer 160 adjacent to the gate 120, such that the as-formed multiple electrical parallel conduction paths can reduce the parasitic resistance of the ohmic contact layer 160 (e.g., parasitic source resistance), and hence the performance (e.g., RF and microwave properties) of the semiconductor device 20 is improved.

Referring to FIG. 5C, an edge 1602 of a portion of the ohmic contact layer 160 may be aligned with an edge 1801 of the portion 181 of the conductive layer 180. An edge 1602 of a portion of the ohmic contact layer 160 adjacent to the gate 120 may be aligned with an edge 1801 of a part of the portion 181 of the conductive layer 180 adjacent to the gate 120.

Figure 5D:
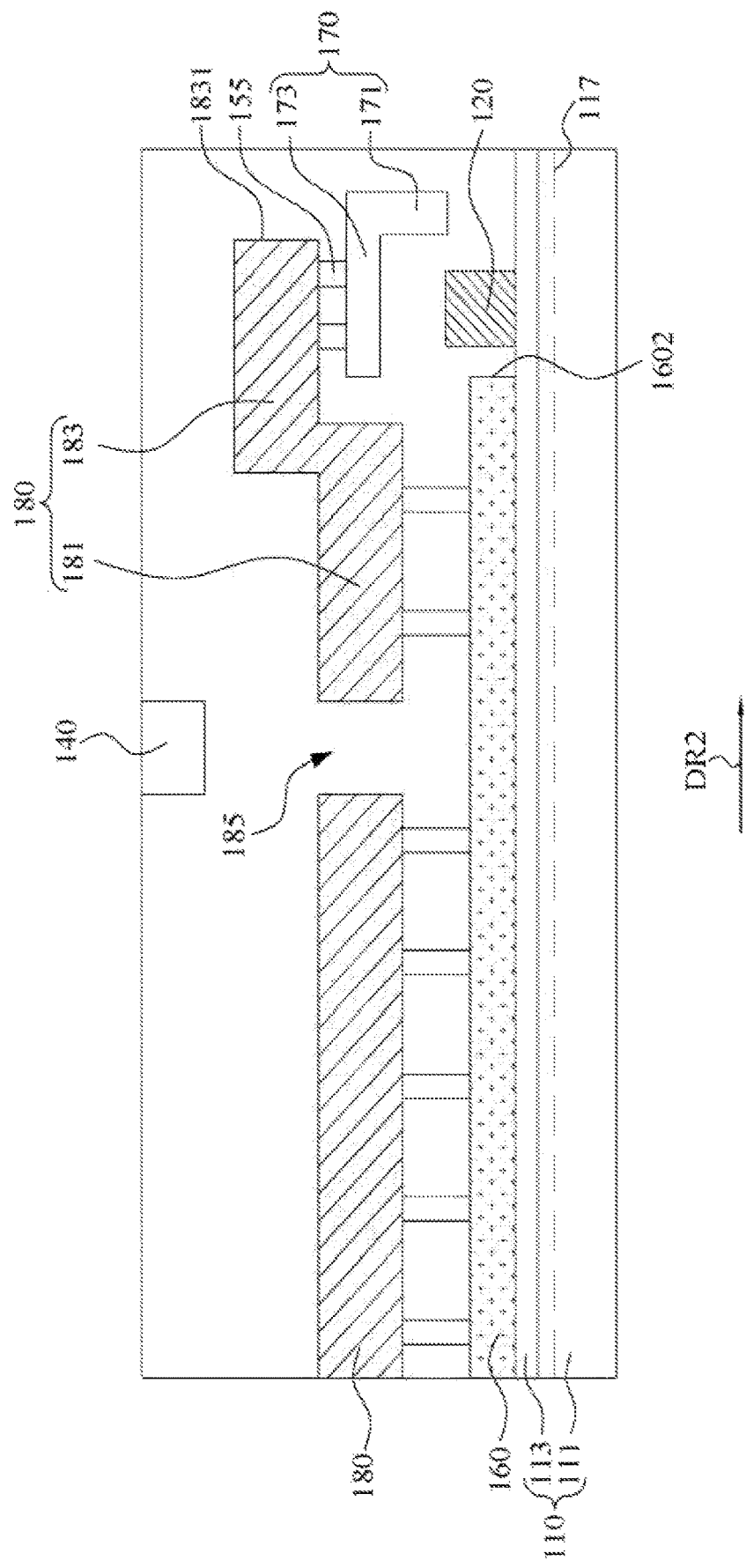
FIG. 5D is a cross-sectional view across the line 5B-5B' in FIG. 4 according to some embodiments of the present disclosure.

FIG. 5D is a cross-sectional view across the line 5B-5B' in FIG. 4 according to some embodiments of the present disclosure.

Referring to FIG. 5D, an edge 1831 of the portion 183 of the conductive layer 180 may protrude from an edge 1602 of a portion of the ohmic contact layer 160. The portion 183 of the conductive layer 180 may be directly above the gate 120.

Figure 5E:
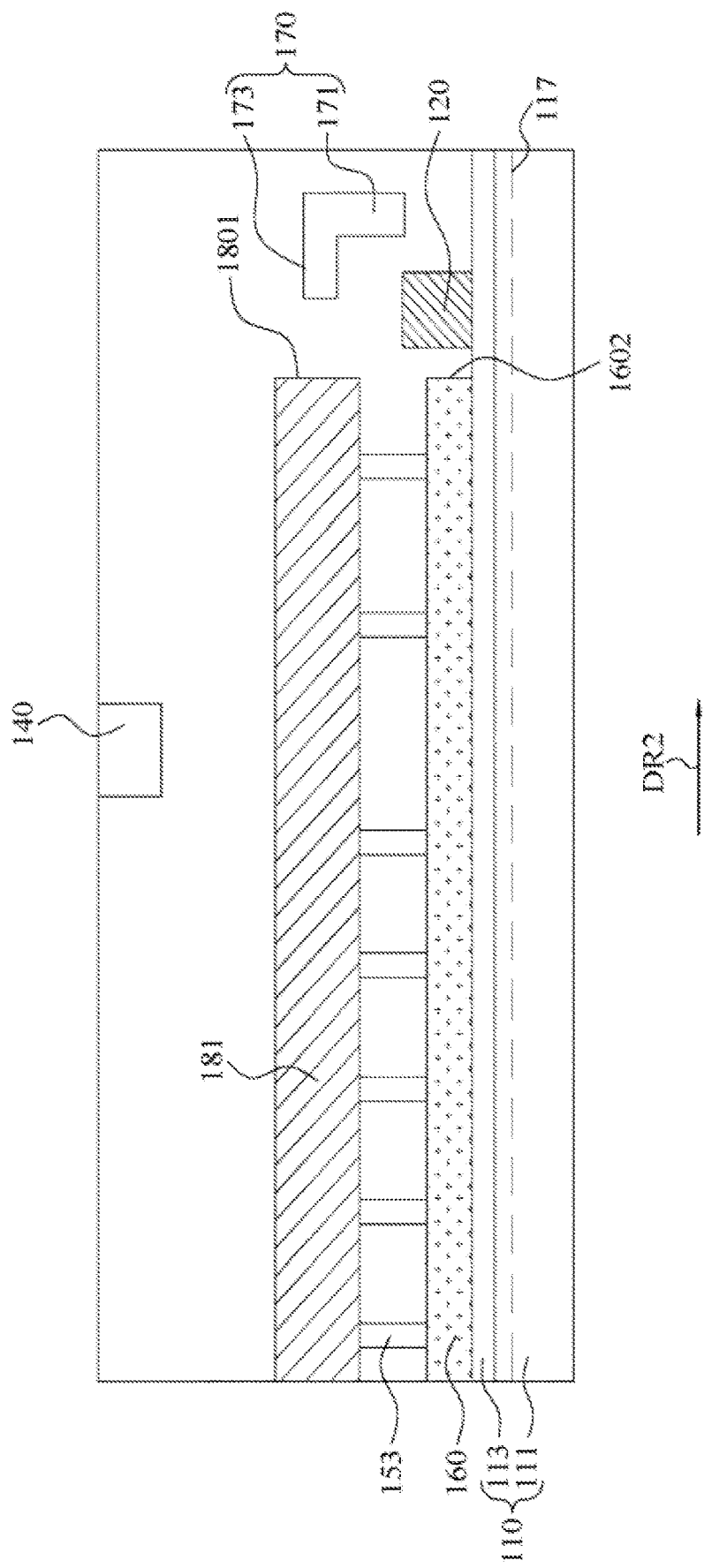
FIG. 5E is a cross-sectional view across the line 5E-5E' in FIG. 4 according to some embodiments of the present disclosure.

FIG. 5E is a cross-sectional view across the line 5E-5E' in FIG. 4 according to some embodiments of the present disclosure.

Referring to FIG. 5E, the gate bus 140 may overlap the portion 181 of the conductive layer 180. The gate bus 140 may partially overlap the portion 181 of the conductive layer 180. A part of the portion 181 of the conductive layer 180 may be directly below the gate bus 140. A part of the portion 181 of the conductive layer 180 may be between the gate bus 140 and the ohmic contact layer 160.

Figure 6:
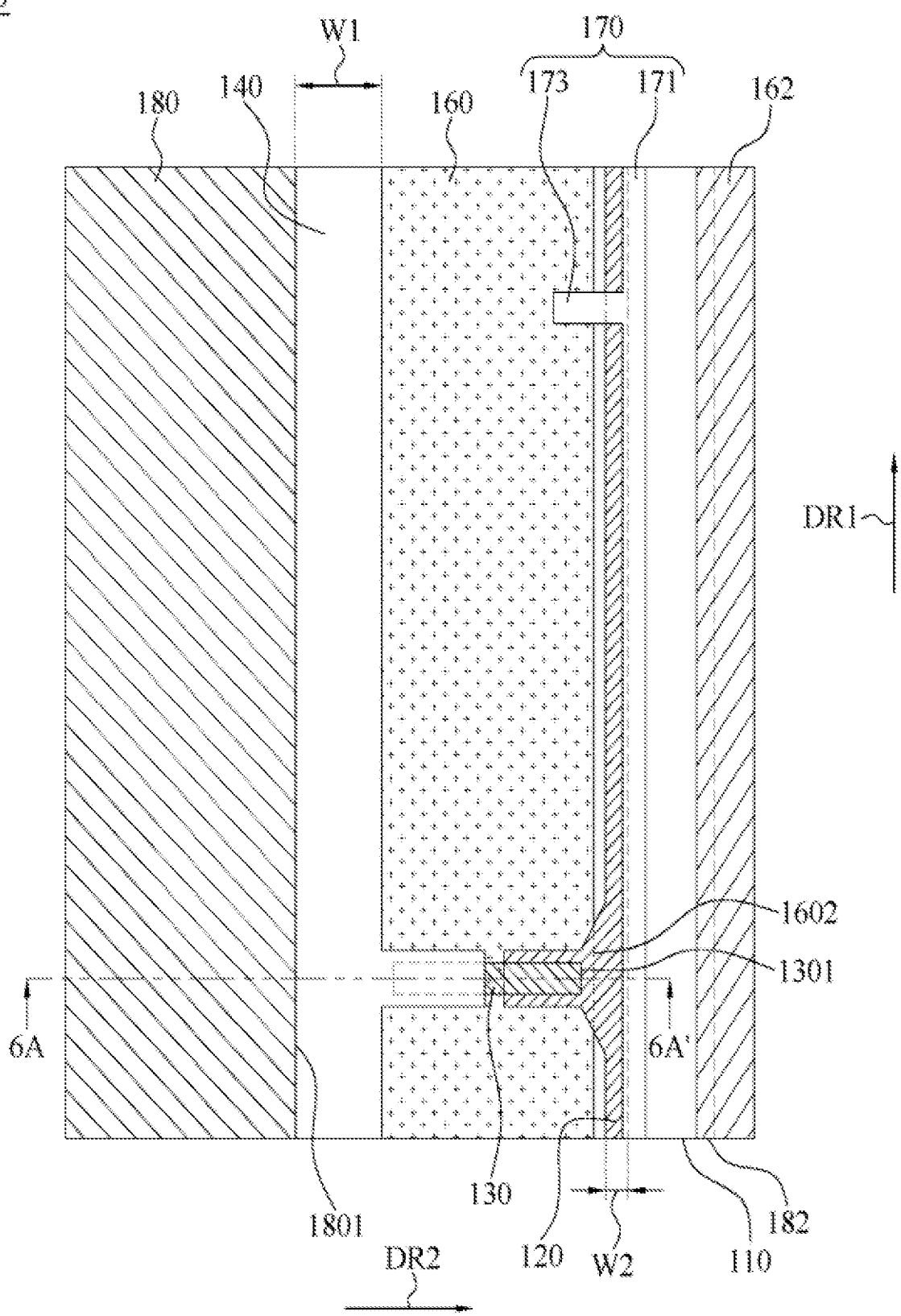
FIG. 6 is a top view of a semiconductor device according to some embodiments of the present disclosure.

FIG. 6 is a top view of a semiconductor device 30 according to some embodiments of the present disclosure. The semiconductor device 30 has a structure similar to the semiconductor device 10 shown in FIG. 1, except that, for example, the ohmic contact layer 160 has a different structure.

The ohmic contact layer 160 may be under the connection structure 130 from a top view perspective. An edge 1301 of the connection structure 130 may be inside an edge 1602 of the ohmic contact layer 160.

Figure 6A:
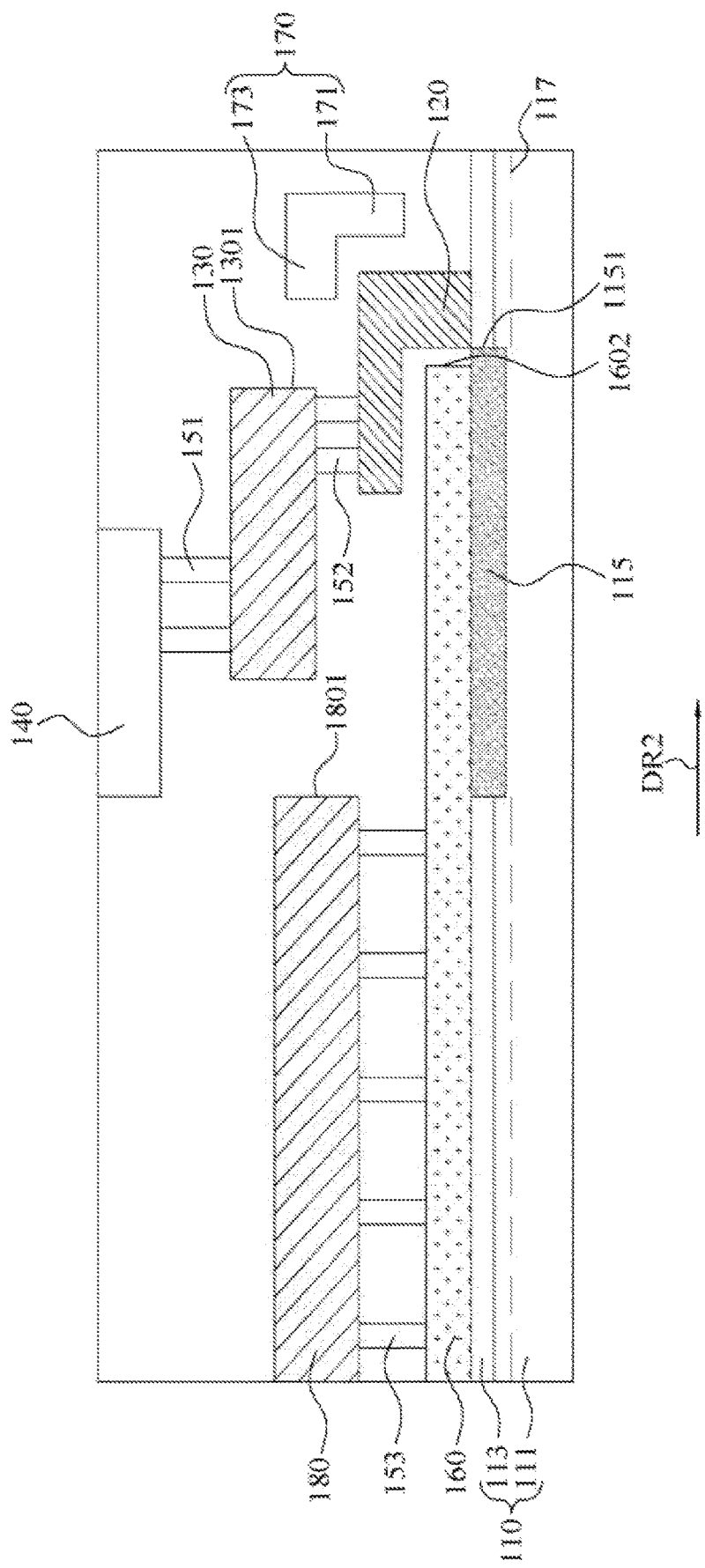
FIG. 6A is a cross-sectional view across the line 6A-6A' in FIG. 6 according to some embodiments of the present disclosure.

FIG. 6A is a cross-sectional view across the line 6A-6A' in FIG. 6 according to some embodiments of the present disclosure.

The semiconductor device 30 may include a structure 115 (which can also be referred to as "a region") in the III-nitride layer 110. A material of the structure 115 may be different from a material of the III-nitride layer 110. A material of the structure 150 may be different from a material of the III-nitride layer 111. A material of the structure 150 may be different from a material of the III-nitride layer 113. The structure 115 may be adjacent to the interface of the III-nitride layer 111 and the III-nitride layer 113. The structure 115 may be formed in the III-nitride layer 111. The structure 115 may be formed in the III-nitride layer 113. The structure 115 may be formed in the III-nitride layer 111 and the III-nitride layer 113. The structure 115 may be directly under the connection structure 130.

The material of the structure 115 may include, for example, without limitation, a doped nitride semiconductor material with a dopant comprising $He^+$, $N^+$, $O^+$, $Fe^+$, $Ar^+$, $Kr^+$, or a combination thereof, a doped group III-V layer (e.g., p-GaN layer), an n-type polysilicon layer, a dielectric material, or a combination thereof. According to some embodiments of the present disclosure, the structure 115 is adjacent to the interface of the III-nitride layer 111 and the III-nitride layer 113 where a 2DEG is supposed to be formed; thus the structure 115 can deplete the 2DEG at the region where the structure 115 is located. Thus, the structure 115 may serve to generate a non-active region where no current passes and have relatively high resistance when the semiconductor device 30 is in operation.

According to some embodiments of the present disclosure, the gate 120 is connected to the gate bus 140 through the connection structure 130, and the connection structure 130 is located directly above a non-active region. Therefore, since there is not 2DEG in the non-active region, the parasitic capacitance which could've been formed from the gate 120 and the 2DEG region is not formed, and thus the overall parasitic capacitance of the gate 120 is significantly reduced.

Please also see FIG. 3A for reference, the semiconductor device 30 may include a plurality of structures 115 in the III-nitride layer 110. Each of the structures 115 may be directly under each of the connection structures 130.

Figure 7A:
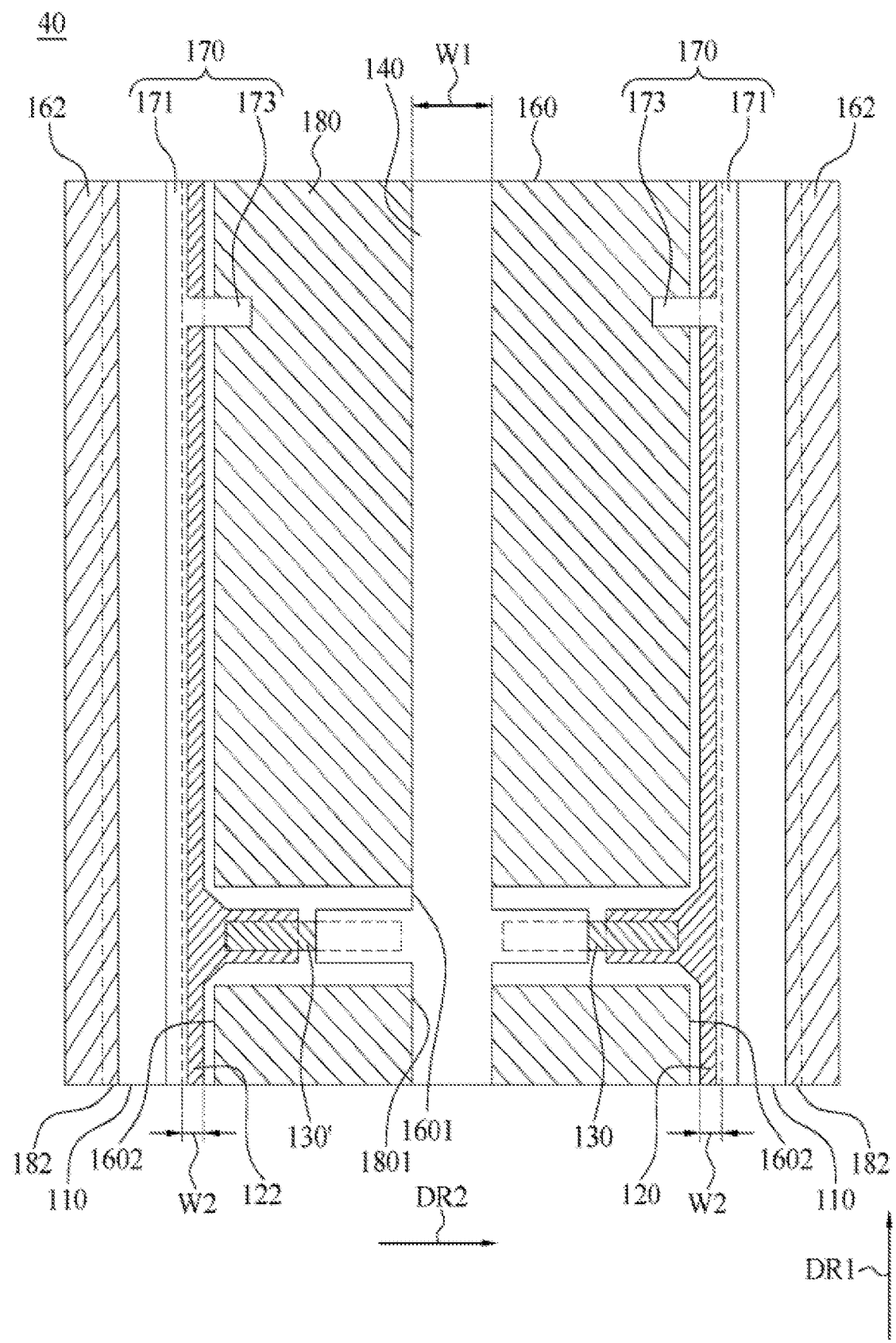
FIG. 7A is a top view of a semiconductor device according to some embodiments of the present disclosure.

FIG. 7A is a top view of a semiconductor device 40 according to some embodiments of the present disclosure.

The semiconductor device 40 may further include a gate 122 extending substantially in parallel to the gate 120 along the direction DR1. The gate 120 and the gate 122 may be located on two opposite sides of the ohmic contact layer 160. The gate 120 and the gate 122 may be located on two opposite sides of the conductive layer 180. The semiconductor device 40 may further include a connection structures 130' disposed over the gate 122.

Figure 7B:
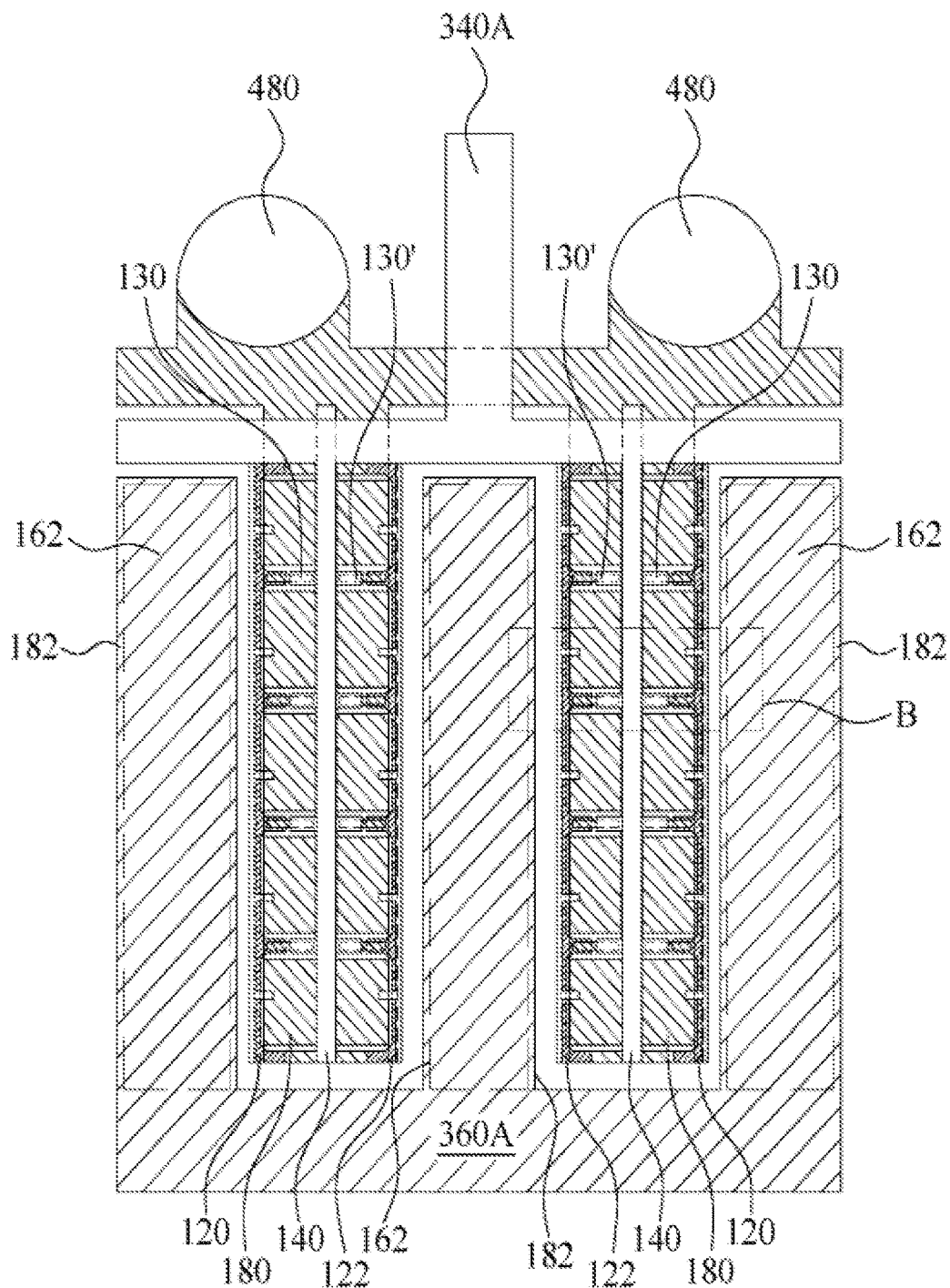
FIG. 7B is a top view of a semiconductor device according to some embodiments of the present disclosure.

FIG. 7B is a top view of a semiconductor device 2 according to some embodiments of the present disclosure. In some embodiments, the structure shown in FIG. 7A can be a partial structure in the dashed line box B of FIG. 7B.

Referring to FIG. 7B, the semiconductor device 2 may further include a plurality of the connection structures 130' disposed over the gate 122. The connection structures 130' may be arranged between the gate bus 140 and the gate 122 from a top view perspective. The gate bus 140 may be electrically connected to the gate 122 through the connection structures 130'.

The semiconductor device 2 may further include a gate connection structure 340A. The gate connection structure 340A may connect the gate bus 140 to a gate pad (not illustrated in FIG. 7B). It should be noted that the number of gate busses 140 connecting to the gate connection structure 340A can be more than two, and is not limited to the embodiment shown in FIG. 2. The gate bus 140 may connect the gates 120 and 122 to the gate connection structure 340A. The semiconductor device 2 may further include a contact pad 360A (e.g., a drain pad). The conductive layer 182 may be connected to the contact pad 360A. The semiconductor device 2 may further include contact plugs 480. The contact plugs 480 can serve as source contact plugs. The conductive layer 180 may connect the ohmic contact layer 160 to the contact plugs 480.

FIGS. 8A, 8B, 8C, 8D and 8E illustrate several operations in manufacturing a semiconductor device according to some embodiments of the present disclosure.

Figure 8A:
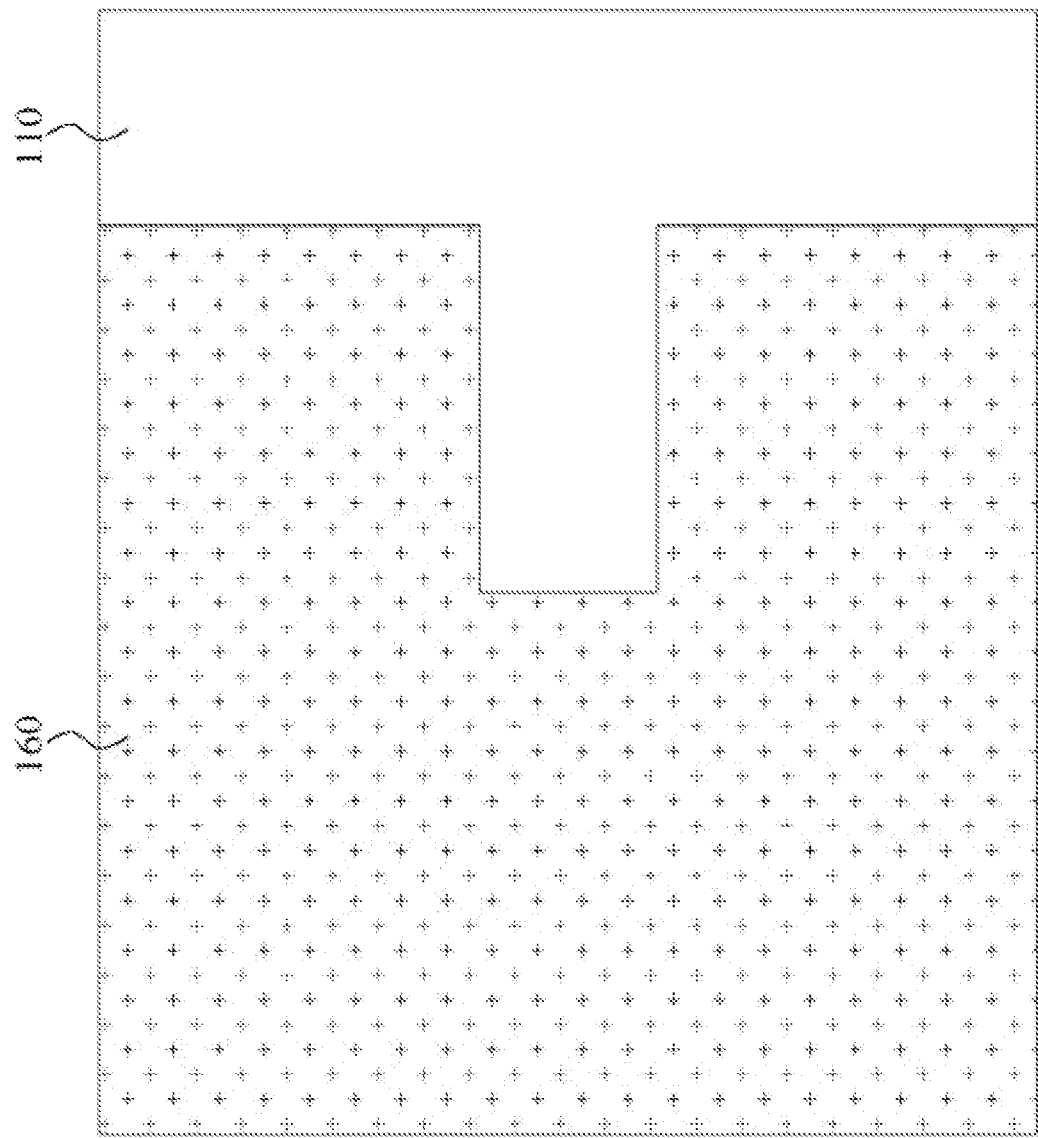
FIGS. 8A, 8B, 8C, 8D and 8E illustrate several operations in manufacturing a semiconductor device according to some embodiments of the present disclosure.

Referring to FIG. 8A, a III-nitride layer 110 is formed. Please also see, for example, FIGS. 2A-2C for reference, the III-nitride layer 110 may be formed by forming a III-nitride layer 111 on a substrate, and forming a III-nitride layer 113 on and in direct contact with the III-nitride layer 113. The III-nitride layers 111 and 113 may be formed by epitaxial growth.

Still referring to FIG. 8A, an ohmic contact layer 160 is formed over the III-nitride layer 110. The ohmic contact layer 160 can be formed by physical vapor deposition (PVD), chemical vapor deposition (CVD), atomic layer deposition (ALD), plating, and/or other suitable deposition steps.

Figure 8B:
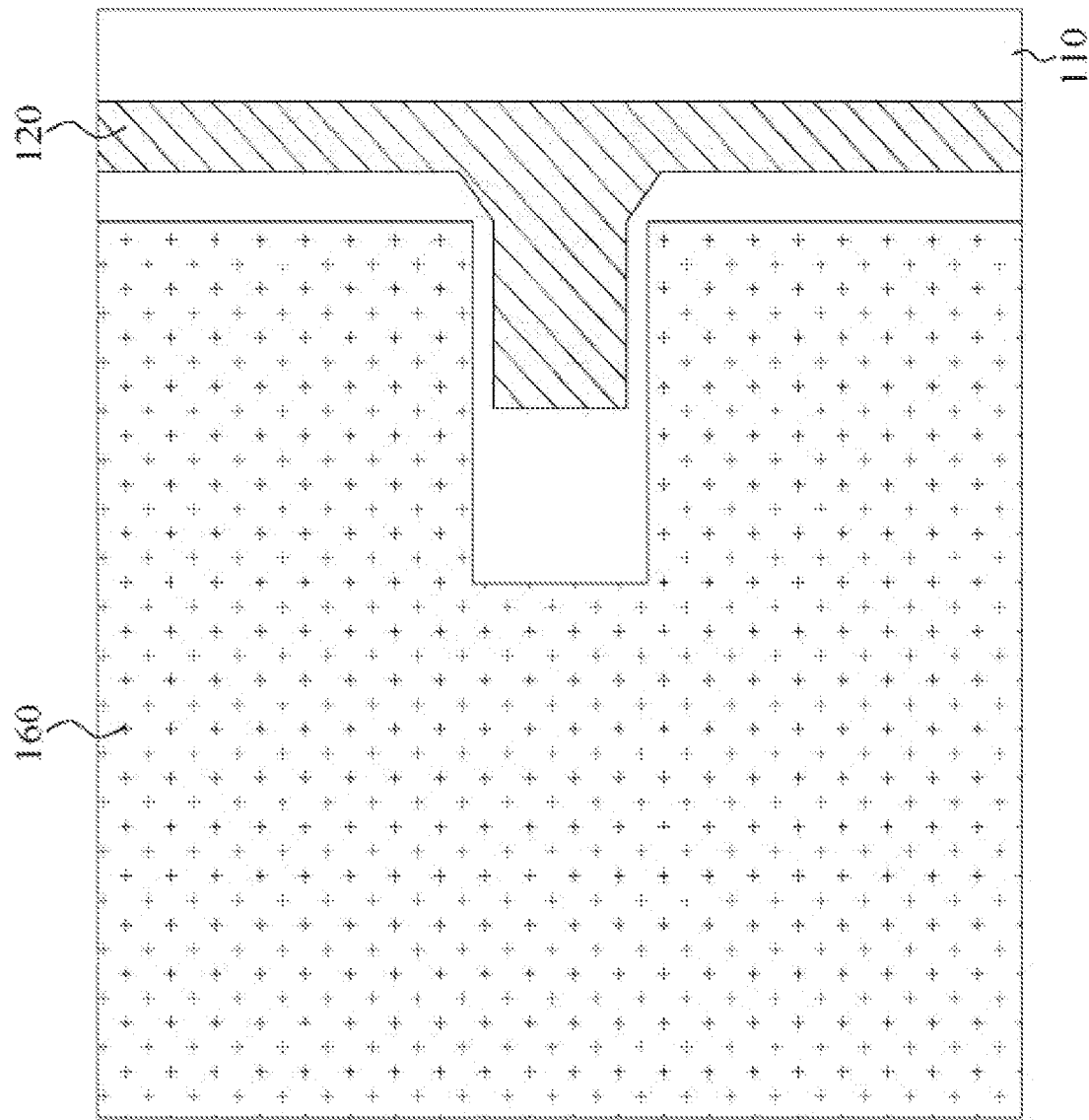

Referring to FIG. 8B, a gate 120 is formed over the III-nitride layer 110. The gate 120 can be formed by physical vapor deposition (PVD), chemical vapor deposition (CVD), atomic layer deposition (ALD), plating, and/or other suitable deposition steps.

Figure 8C:
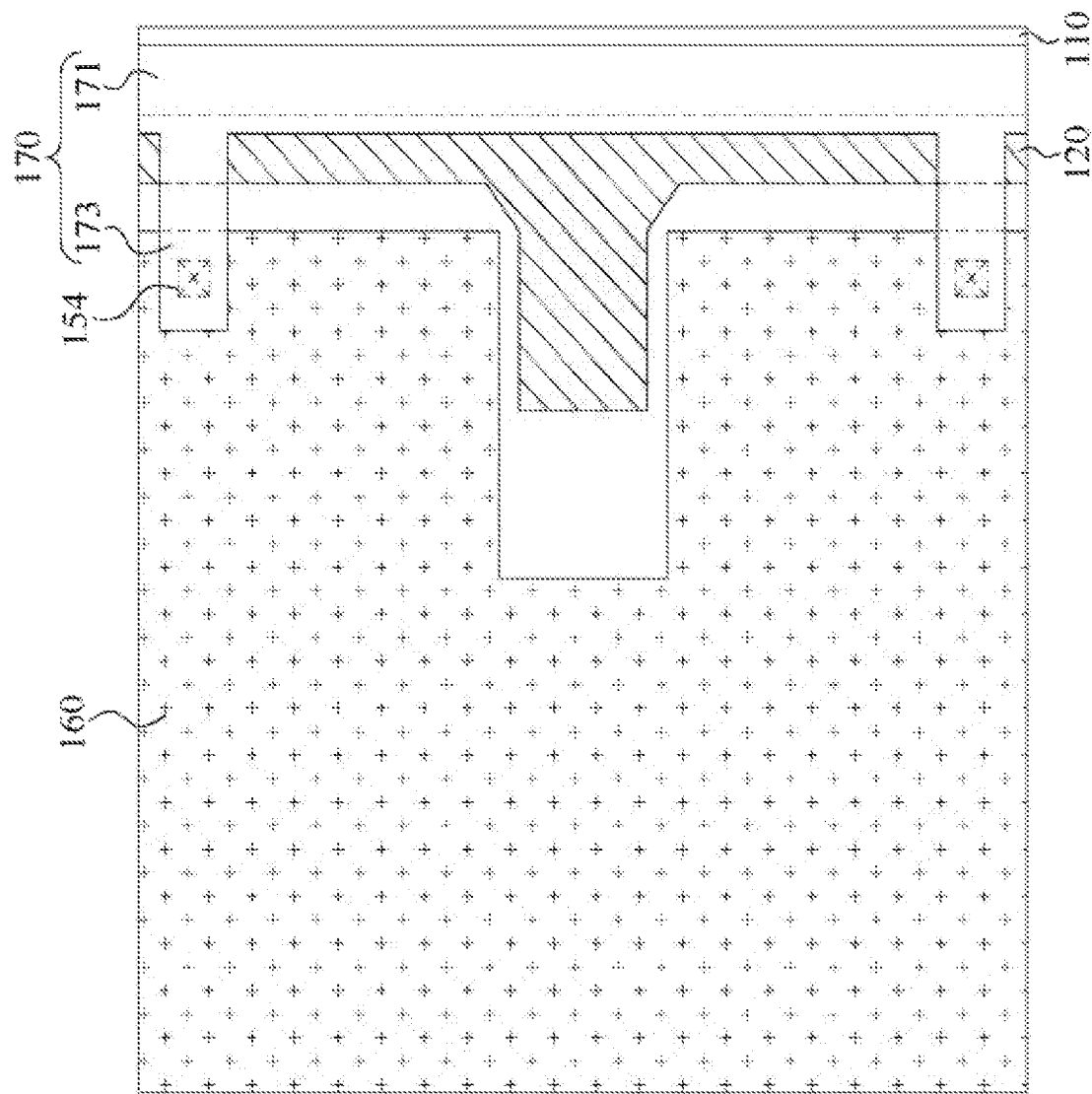

Referring to FIG. 8C, a conductive layer 170 is formed over the ohmic contact layer 160. The conductive layer 170 may include a portion 171 elevationally substantially the same as the gate 120 and a portion 173 above the gate 120. One or more conductive vias 154 may be formed on the ohmic contact layer 160, and then the conductive layer 170 may be formed on the conductive vias 154 to electrically connect the ohmic contact layer 160 and the conductive layer 170.

Figure 8D:
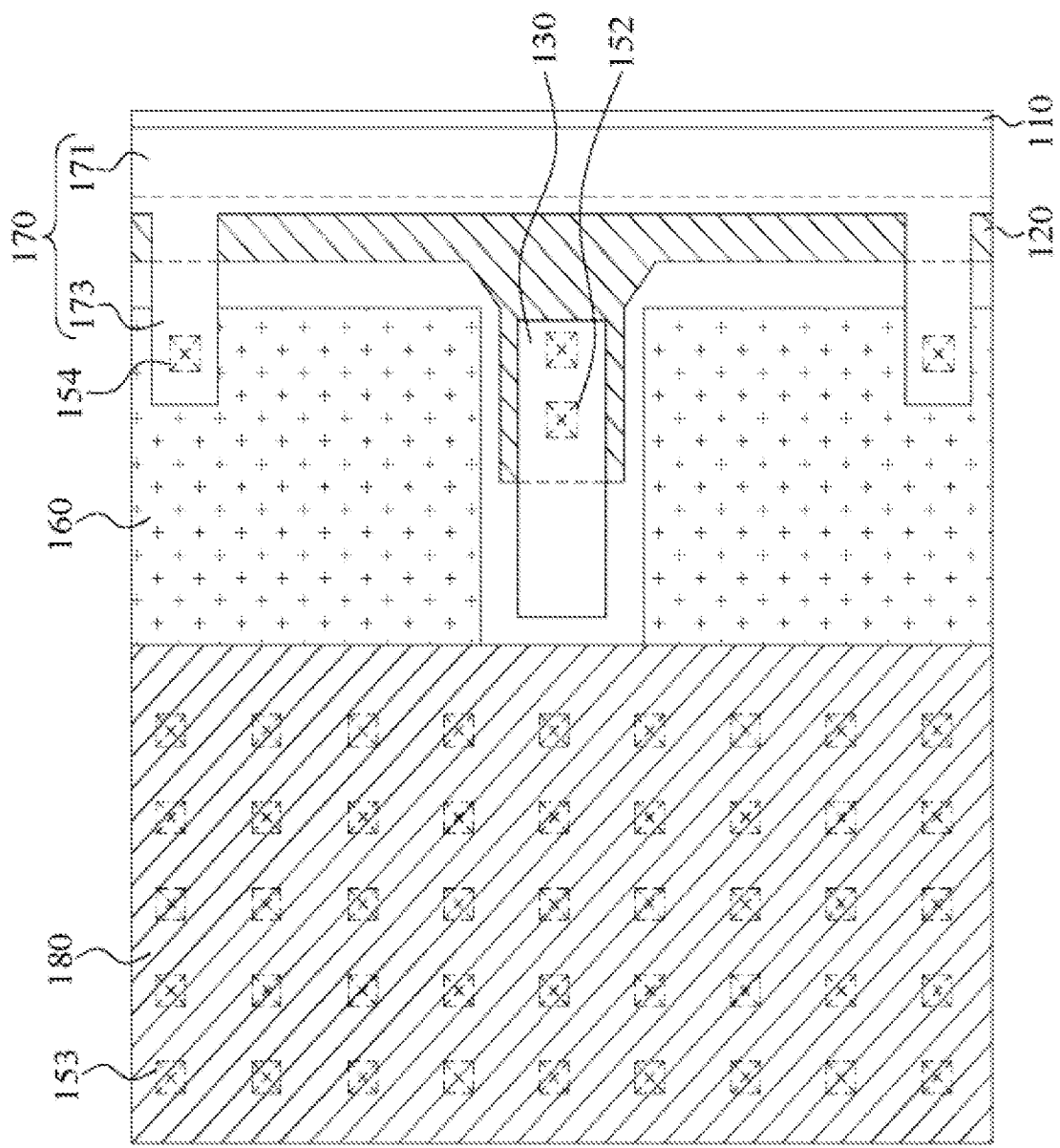

Referring to FIG. 8D, a connection structure 130 is formed over the gate 120, and a conductive layer 180 is formed over the ohmic contact layer 160. Forming the conductive layer 180 and forming the connection structure 130 may be performed in the same step.

A plurality of conductive vias 152 may be formed on the gate 120 prior to forming the connection structure 130. The connection structure 130 may be formed on the conductive vias 152 to electrically connect the gate 120 and the connection structure 130. A plurality of conductive vias 153 may be formed on the ohmic contact layer 160 prior to forming the conductive layer 180. The conductive layer 180 may be formed on the conductive vias 153 to electrically connect the ohmic contact layer 160 and the conductive layer 180.

Figure 8E:
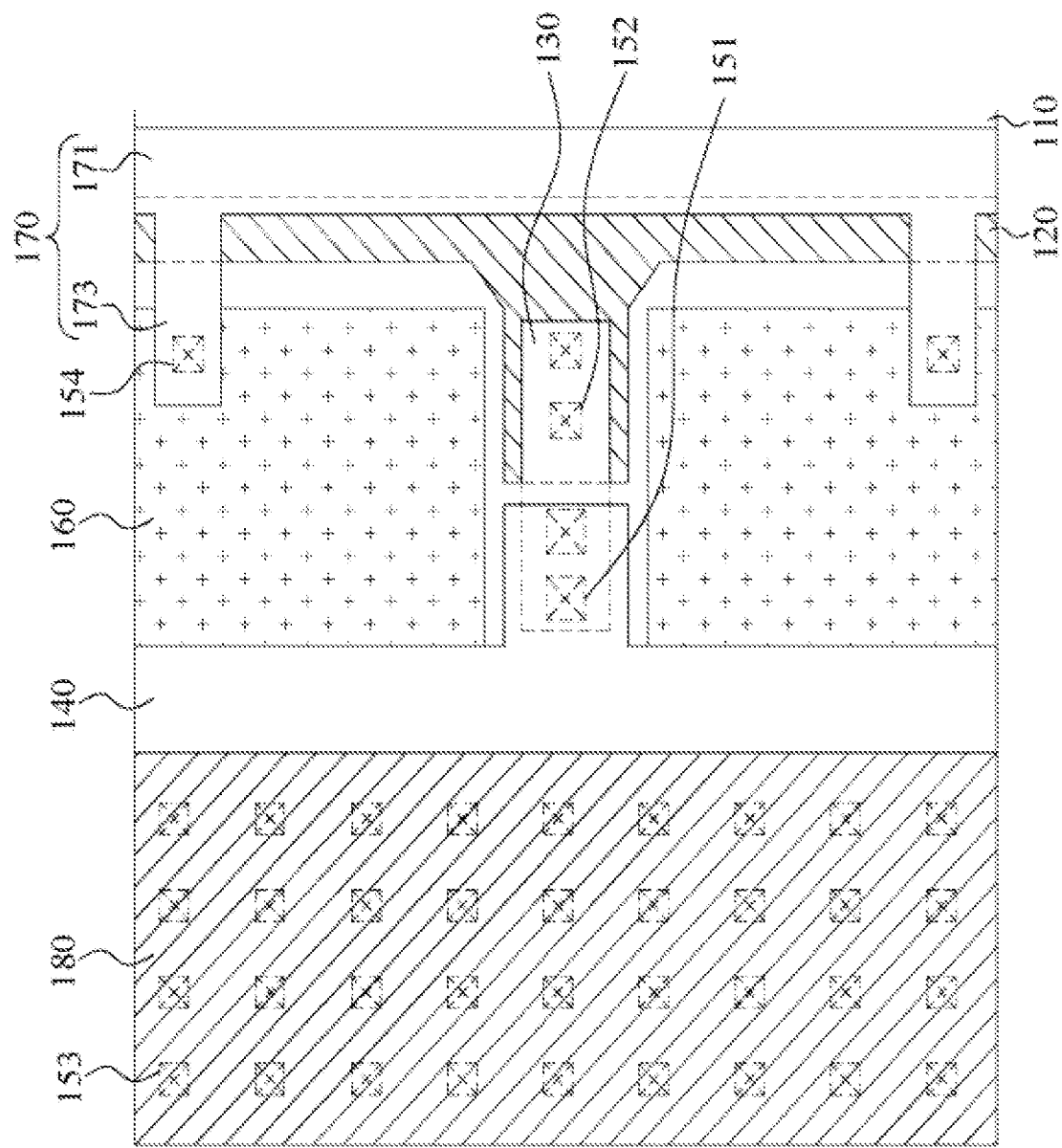

Referring to FIG. 8E, a gate bus 140 is formed over the connection structure 130 from a top view perspective. The gate bus 140 may extend substantially in parallel to the gate 120. The gate bus 140 may be electrically connected to the gate 120 through the connection structure 130.

A plurality of conductive vias 151 may be formed on the connection structure 130 prior to forming the gate bus 140. The gate bus 140 may be formed on the conductive vias 151 to electrically connect the gate bus 140 and the gate 120. As such, the semiconductor device 10 shown in FIGS. 1 and 2A-2C is formed.

Figure 9A:
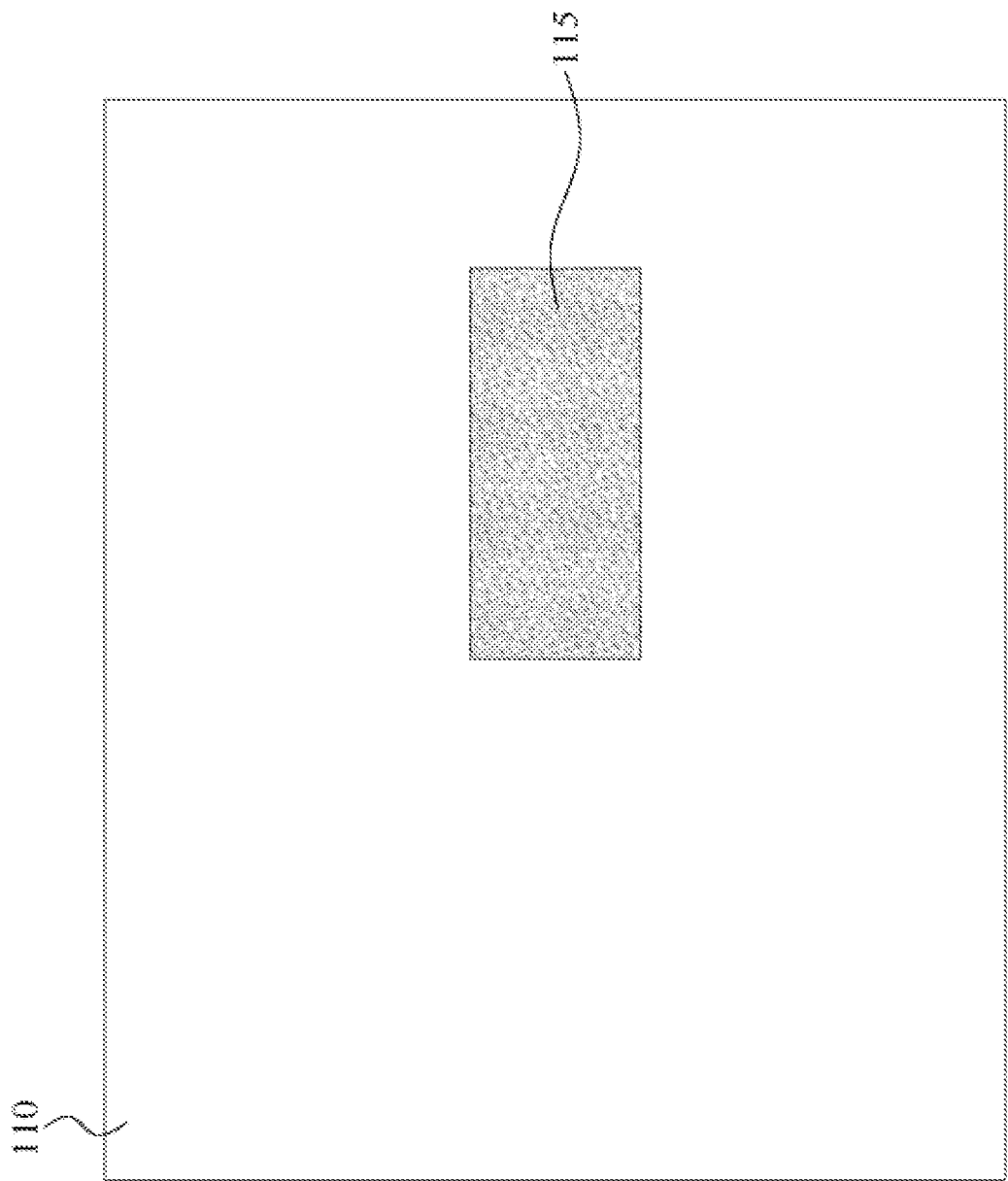
FIGS. 9A, 9B and 9C illustrate several operations in manufacturing a semiconductor device according to some embodiments of the present disclosure.
Figure 9B:
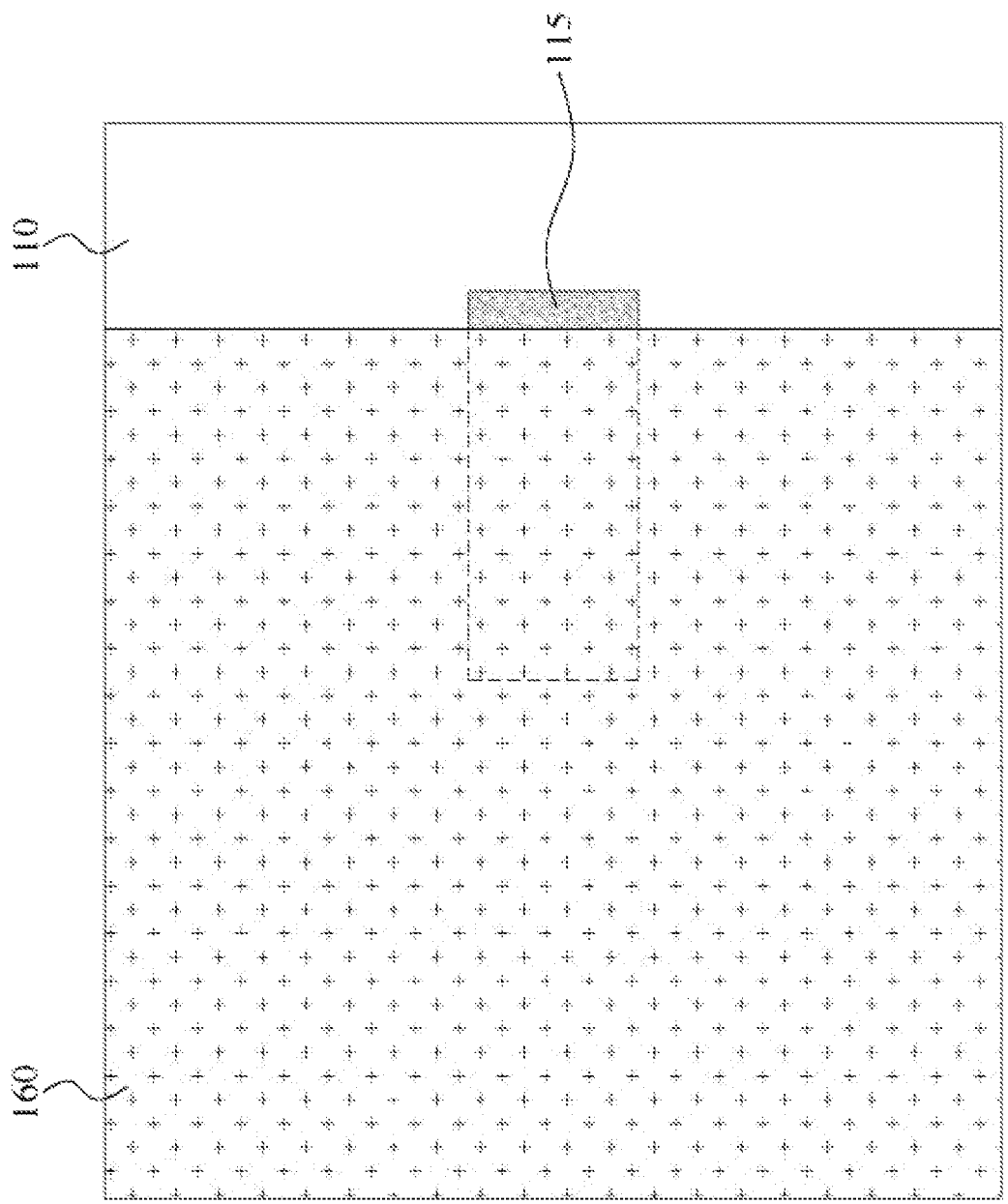
Figure 9C:
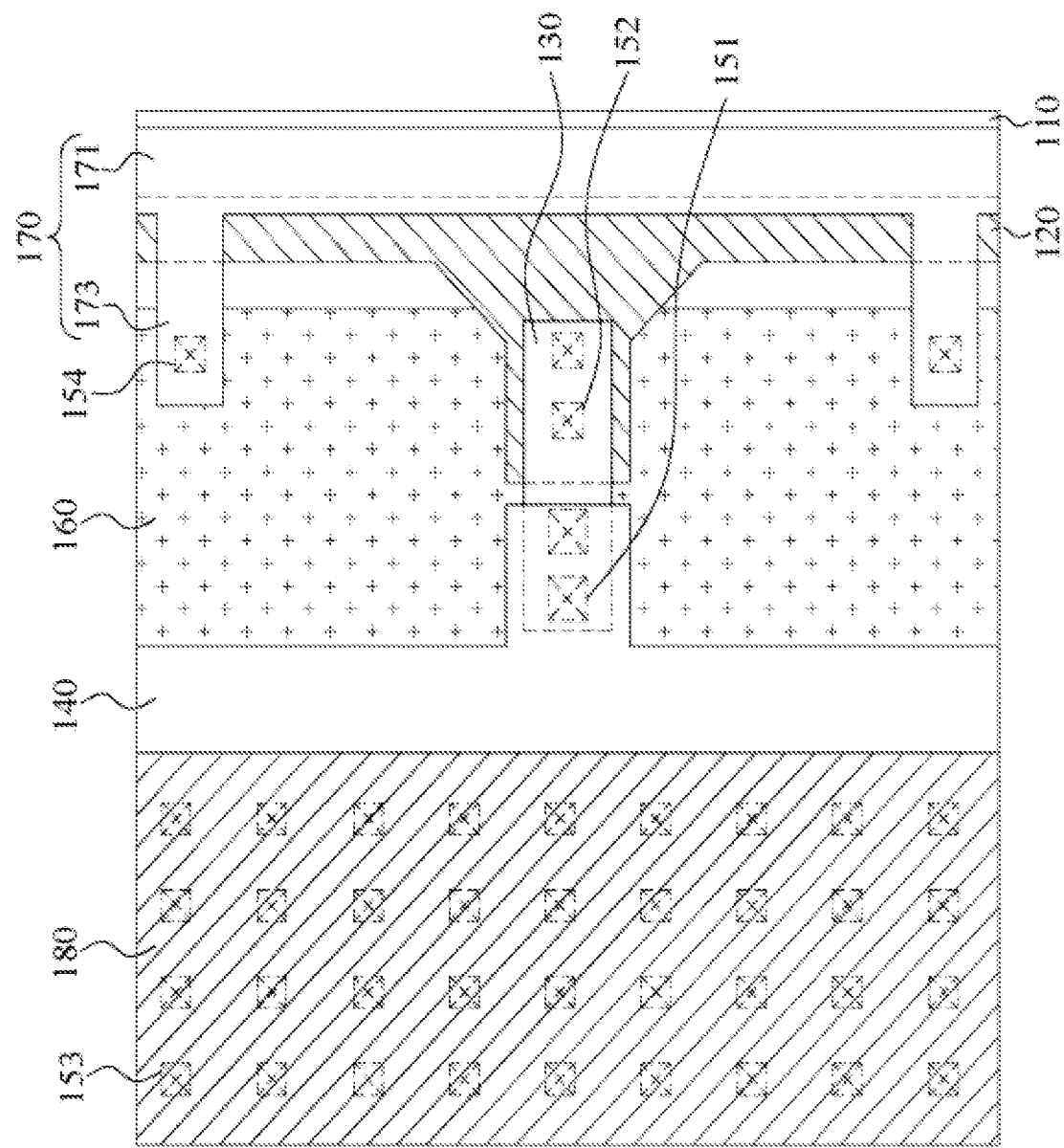

FIGS. 9A, 9B and 9C illustrate several operations in manufacturing a semiconductor device according to some embodiments of the present disclosure.

Referring to FIG. 9A, a III-nitride layer 110 is formed, and a structure 115 is formed in the III-nitride layer 110. The structure 115 may be formed adjacent to the interface of the III-nitride layer 111 and the III-nitride layer 113. The structure 115 may be formed by, for example, performing an implantation process on at least a portion of the III-nitride layer 113, so as to form the structure 115 in the III-nitride layer 113. The structure 115 may be formed by, for example, performing an implantation process on a portion of the III-nitride layer 111 and a portion of the III-nitride layer 113, so as to form the structure 115 in the III-nitride layers 111 and 113.

In some other embodiments, the structure 115 may be formed by, for example, removing a portion of the III-nitride layer 110 to form a recess, and filling a material into the recess so as to form the structure 115. The material to be filled in the recess may include a doped group III-V layer (e.g., p-GaN layer), an n-type polysilicon layer, a dielectric material, or a combination thereof.

Referring to FIG. 9B, an ohmic contact layer 160 is formed over the III-nitride layer 110 and the structure 115.

Referring to FIG. 9C, operations illustrated in FIGS. 8B-8E are performed to form a gate 120 over the III-nitride layer 110, a conductive layer 170 over the ohmic contact layer 160, a connection structure 130 over the gate 120 and the structure 115, a conductive layer 180 over the ohmic contact layer 160, and a gate bus 140 over the connection structure 130 and the structure 115. As such, the semiconductor device 30 shown in FIGS. 6 and 6A is formed.

Figure 10A:
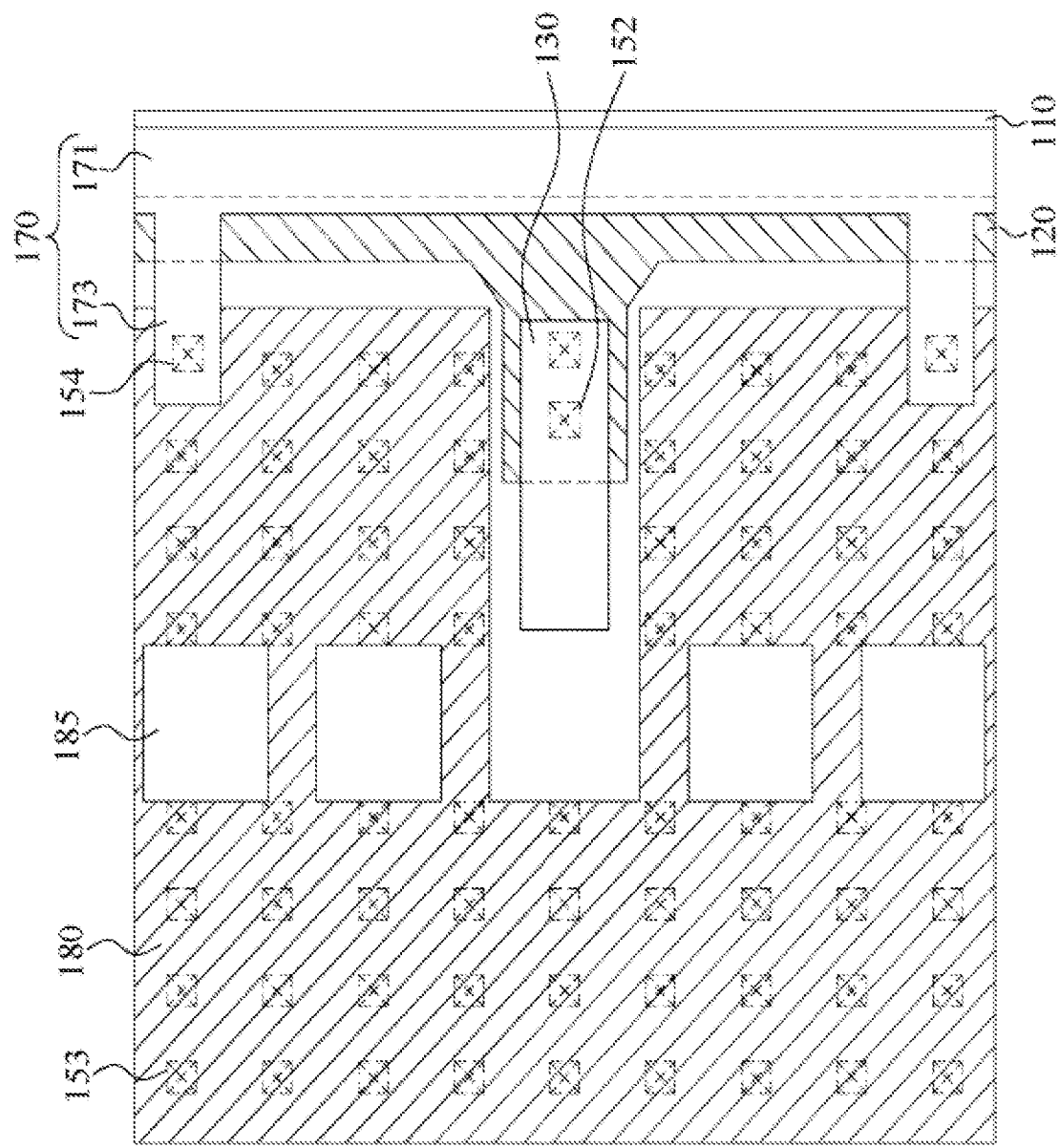
FIGS. 10A and 10B illustrates several operations in manufacturing a semiconductor device according to some embodiments of the present disclosure.
Figure 10B:
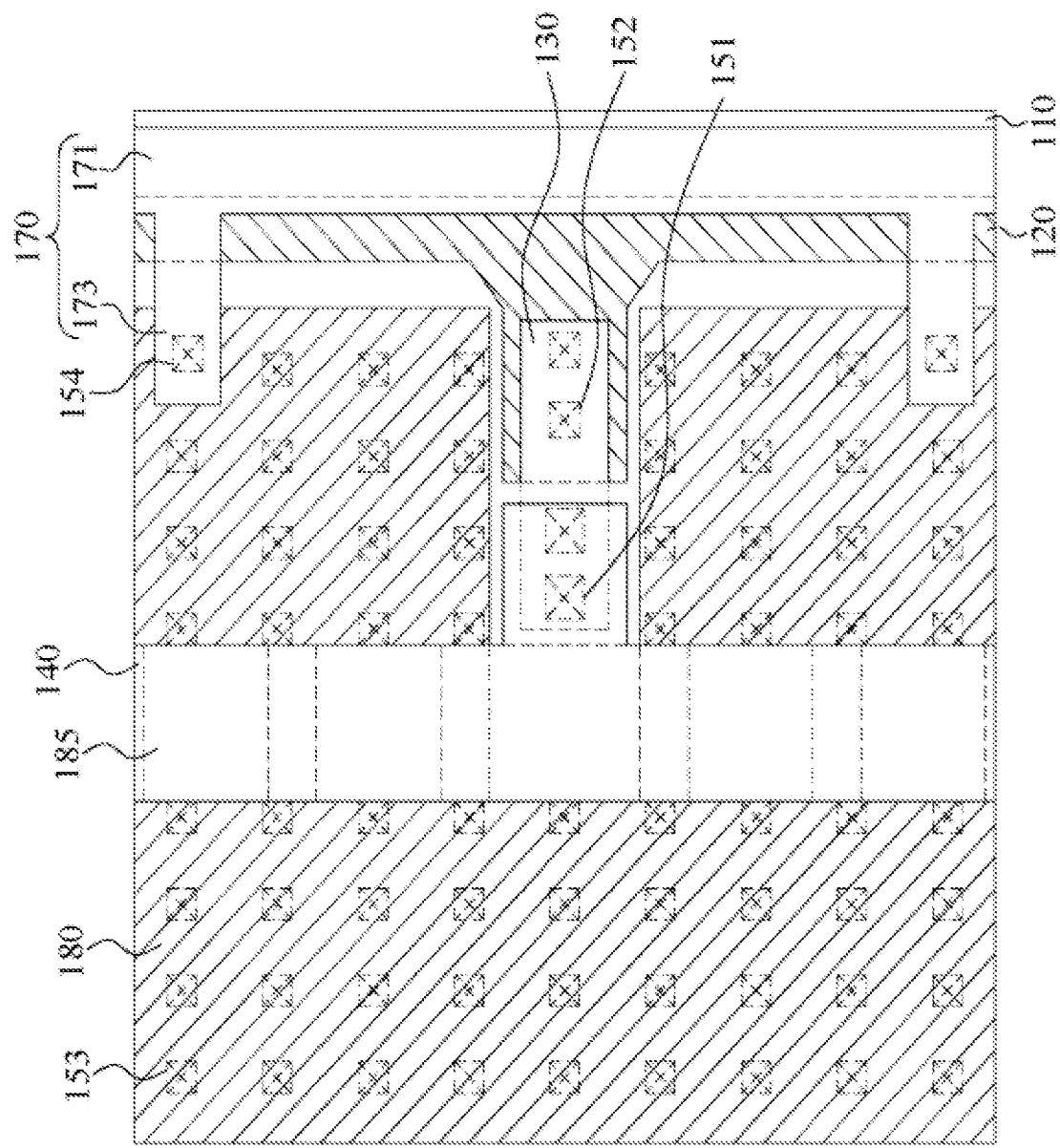

FIGS. 10A and 10B illustrates several operations in manufacturing a semiconductor device according to some embodiments of the present disclosure.

First, operations illustrated in FIGS. 8A-8D are performed to form a III-nitride layer 110, an ohmic contact layer 160 over the III-nitride layer 110, a gate 120 over the III-nitride layer 110, a conductive layer 170 including portions 171 and 173 over the ohmic contact layer 160, a connection structure 130 over the gate 120, and a conductive layer 180 over the ohmic contact layer 160 and the portion 173 of the conductive layer 170.

Referring to FIG. 10A, portions of the conductive layer 180 are removed to form a plurality of openings 185. The portions of the conductive layer 180 may be removed by, for example, one or more etching steps, and the etching step(s) may be performed by dry etching, wet etching, or a combination of dry and wet etching.

Referring to FIG. 10B, a gate bus 140 is formed directly above the plurality of openings 185. As such, the semiconductor device 2 shown in FIGS. 4 and 5A-5C is formed.

As used herein, spatially relative terms, such as "beneath," "below," "lower," "above," "upper," "higher," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
   a III-nitride layer;
   a gate disposed over the III-nitride layer;
   a connection structure disposed over the gate;
   a gate bus extending substantially in parallel to the gate and disposed over the connection structure from a top view perspective;
   wherein the gate bus is electrically connected to the gate through the connection structure; and
   a conductive layer including a first portion elevationally substantially the same as the gate and a second portion above the gate;
   wherein the second portion of the conductive layer crosses over a portion of the gate;
   wherein the semiconductor device further comprises:
   an ohmic contact layer disposed over the III-nitride layer;
   a first conductive layer disposed above the ohmic contact layer; and
   a plurality of conductive vias disposed between and electrically connecting the ohmic contact layer and the first conductive layer, wherein the first conductive layer defines a plurality of openings directly under the gate bus.

2. The semiconductor device according to claim 1, wherein the gate extends along a first direction, and the connection structure extends along a second direction that is substantially perpendicular to the first direction.

3. The semiconductor device according to claim 2, wherein a width of the gate bus along the second direction is greater than a width of the gate along the second direction.

4. The semiconductor device according to claim 3, wherein a ratio of the width of the gate bus along the second direction to the width of the gate along the second direction is equal to or greater than 5.

5. The semiconductor device according to claim 1, wherein the connection structure is disposed between the gate bus and the gate.

6. The semiconductor device according to claim 1, further comprising:
   a first conductive via stacked between and electrically connecting the connection structure and the gate.

7. The semiconductor device according to claim 6, further comprising:
   a second conductive via disposed between the gate bus and the connection structure and electrically connecting the gate bus and the connection structure.

8. The semiconductor device according to claim 1, further comprising:
   an ohmic contact layer disposed at an elevation lower than the connection structure.

9. The semiconductor device according to claim 1, wherein the first portion of the conductive layer extends substantially in parallel to the gate along a first direction.

10. The semiconductor device according to claim 1, further comprising:
    a second conductive layer including:
       a first portion disposed elevationally substantially the same as the gate; and
       a second portion above the gate and electrically connected to the first conductive layer.

11. The semiconductor device according to claim 10, wherein the second portion of the conductive layer is disposed between the gate and the first conductive layer.

12. The semiconductor device according to claim 1, further comprising:
    a structure in the III-nitride layer, wherein a material of the structure is different from a material of the III-nitride layer, and the structure is directly under the connection structure.

13. A semiconductor device, comprising:
    a III-nitride layer;
    a first ohmic contact layer and a second ohmic contact layer over the III-nitride layer;
    a first gate extending between the first ohmic contact layer and the second ohmic contact layer along a first direction;
    a first connection structure and a second connection structure disposed over the first gate;
    a gate bus extending substantially in parallel to the first gate along the first direction and disposed over the first connection structure and the second connection structure from a top view perspective, wherein the gate bus is electrically connected to the first gate through the first connection structure and the second connection structure; and
    a conductive layer including a first portion elevationally substantially the same as the first gate and a second portion above the first gate;
    wherein the second portion of the conductive layer crosses over a portion of the first gate;
    wherein the first connection structure and the second connection structure are arranged between the gate bus and the first gate.

14. The semiconductor device according to claim 13, wherein the semiconductor device comprises a first cell and a second cell arranged in substantially parallel to the first gate along the first direction, the first connection structure is arranged corresponding to the first cell, and the second connection structure is arranged corresponding to the second cell.

15. The semiconductor device according to claim 13, further comprising:
    a first region and a second region in the III-nitride layer, wherein a material of the first region and the second region is different from a material of the III-nitride layer, the first region is directly under the first connection structure, and the second region is directly under the second connection structure.

16. The semiconductor device according to claim 13, further comprising:
    a second gate extending substantially in parallel to the first gate along the first direction, the first gate and the second gate located on two opposite sides of the first ohmic contact layer.

17. The semiconductor device according to claim 16, further comprising:
    a third connection structure and a fourth connection structure disposed over the second gate, wherein the gate bus is electrically connected to the second gate through the third connection structure and the fourth connection structure.

18. A method for fabricating a semiconductor device, comprising:
   forming a III-nitride layer;
   forming a gate over the III-nitride layer;
   forming a connection structure over the gate;
   forming a gate bus over the connection structure from a top view perspective, wherein the gate bus extends substantially in parallel to the gate, and the gate bus is electrically connected to the gate through the connection structure;
   forming an ohmic contact layer over the III-nitride layer;
   forming a first conductive layer over the ohmic contact layer, wherein the first conductive layer includes a first portion elevationally substantially the same as the gate and a second portion above the gate; and
   forming a second conductive layer over the ohmic contact layer, wherein forming the second conductive layer and forming the connection structure are performed in the same step.

19. The method according to claim 18, further comprising:
   forming a plurality of conductive vias on the ohmic contact layer prior to forming the second conductive layer, wherein the plurality of conductive vias electrically connect the ohmic contact layer and the second conductive layer.

20. The method according to claim 18, further comprising:
   removing portions of the second conductive layer to form a plurality of openings prior to forming the gate bus, wherein the gate bus is formed directly above the plurality of openings.

* * * * *